United States Patent
Mashita et al.

(10) Patent No.: US 12,355,597 B2
(45) Date of Patent: Jul. 8, 2025

(54) COMMUNICATOR AND COMMUNICATION DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Makoto Mashita, Yokkaichi (JP); Akira Miyajo, Yokkaichi (JP); Masakatsu Moriguchi, Yokkaichi (JP); Takeshi Hagihara, Yokkaichi (JP); Hirofumi Urayama, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 98 days.

(21) Appl. No.: 18/552,568

(22) PCT Filed: Mar. 15, 2022

(86) PCT No.: PCT/JP2022/011518
§ 371 (c)(1),
(2) Date: Sep. 26, 2023

(87) PCT Pub. No.: WO2022/209843
PCT Pub. Date: Oct. 6, 2022

(65) Prior Publication Data
US 2024/0187289 A1 Jun. 6, 2024

(30) Foreign Application Priority Data

Mar. 30, 2021 (JP) .................................. 2021-058104
Jun. 8, 2021 (JP) .................................. 2021-096006

(51) Int. Cl.
*H04L 25/20* (2006.01)
*H01R 4/34* (2006.01)
(Continued)

(52) U.S. Cl.
CPC .............. *H04L 25/20* (2013.01); *H05K 1/148* (2013.01); *H01R 4/34* (2013.01); *H01R 12/722* (2013.01)

(58) Field of Classification Search
CPC ......... H04L 25/20; H04L 25/02; H04L 25/24; H05K 1/148; H05K 1/02; H05K 1/14;
(Continued)

(56) References Cited

U.S. PATENT DOCUMENTS 4,091,515 A * 5/1978 Akiyama ............... H01R 43/20
29/33 M
5,932,523 A * 8/1999 Fujikami ............ H10N 60/0801
505/231
(Continued)

FOREIGN PATENT DOCUMENTS

JP 2007-287471 A 11/2007
JP 2017-034372 A 2/2017

OTHER PUBLICATIONS

International Search Report, Application No. PCT/JP2022/011518, mailed Jun. 7, 2022. ISA/Japan Patent Office.

*Primary Examiner* — James M Perez
(74) *Attorney, Agent, or Firm* — Honigman LLP

(57) ABSTRACT

A communicator (relay) receives a differential signal that is a voltage difference between two electrical signals that propagate through two respective conducting wires. The communicator removes noise from the two electrical signals using a first conductor as a reference potential. The communicator converts the differential signal that is the voltage difference between the two electrical signals with the noise (Continued)

removed into a voltage signal that is a voltage with the reference potential corresponding to a potential of a second conductor. The first conductor and the second conductor are respectively disposed on a first substrate and a second substrate. The first substrate and the second substrate are connected via a substrate connector with flexibility.

20 Claims, 31 Drawing Sheets

(51) Int. Cl.
*H01R 12/72* (2011.01)
*H05K 1/14* (2006.01)

(58) Field of Classification Search
CPC ............ H05K 1/16; H05K 1/18; H05K 1/181; H05K 1/185; H05K 1/189; H01R 4/34; H01R 12/722; H01R 4/28; H01R 4/30; H01R 12/70; H01R 12/71; H01R 12/72; H01R 12/728; H01R 12/77; H01R 12/771; H01R 12/775
See application file for complete search history.

(56) References Cited

U.S. PATENT DOCUMENTS

| | | | | |
|---|---|---|---|---|
| 6,288,342 | B1* | 9/2001 | Ueoka | H01B 7/292 174/120 SR |
| 7,274,081 | B2* | 9/2007 | Iguchi | H10F 39/80 257/446 |
| 7,528,319 | B2* | 5/2009 | Kondo | H01B 3/445 174/36 |
| 7,786,378 | B2* | 8/2010 | Kondo | H01B 3/445 174/126.1 |
| 7,817,007 | B2* | 10/2010 | Lee | H01F 17/04 336/200 |
| 7,908,124 | B2* | 3/2011 | Hirose | H01B 12/06 703/1 |
| 8,980,135 | B2* | 3/2015 | Takeda | C01G 41/00 252/582 |
| 9,103,976 | B2* | 8/2015 | Masuyama | G02B 6/131 |
| 9,780,499 | B2* | 10/2017 | Takata | B60L 53/65 |
| 9,781,868 | B2* | 10/2017 | Wakabayashi | H05K 1/0228 |
| 9,851,772 | B2* | 12/2017 | Dwelley | H04L 12/10 |
| 9,887,515 | B2* | 2/2018 | Furuya | H01S 5/0235 |
| 9,923,337 | B2* | 3/2018 | Yoshinaga | H01S 5/02345 |
| 10,135,626 | B2* | 11/2018 | Pischl | H04L 12/10 |
| 10,383,215 | B2* | 8/2019 | Kouchi | H05K 1/056 |
| 10,594,367 | B1* | 3/2020 | Bhagwat | H04B 3/54 |
| 10,703,889 | B2* | 7/2020 | Yanagawa | H01B 3/447 |
| 10,812,290 | B2* | 10/2020 | Iwata | H04L 12/40 |
| 10,815,586 | B2* | 10/2020 | Ishikawa | H10D 62/85 |
| 10,824,044 | B2* | 11/2020 | Kono | G02F 1/011 |
| 10,826,720 | B2* | 11/2020 | Iwata | H04L 12/4625 |
| 11,050,403 | B2* | 6/2021 | Higuchi | H01F 17/04 |
| 11,152,973 | B2* | 10/2021 | Mashita | H04B 3/548 |
| 11,227,947 | B2* | 1/2022 | Hiyoshi | H10D 62/8325 |
| 11,289,241 | B2* | 3/2022 | Kojima | H01B 7/0823 |
| 11,290,291 | B2* | 3/2022 | Gardner | H04L 25/0298 |
| 11,309,103 | B2* | 4/2022 | Nagano | H01B 11/1091 |
| 11,418,369 | B2* | 8/2022 | Gardner | H04L 12/10 |
| 11,456,884 | B2* | 9/2022 | Hartnett | H04L 12/10 |
| 11,671,142 | B2* | 6/2023 | Lo | H04B 1/30 375/346 |
| 11,715,582 | B2* | 8/2023 | Kojima | H01B 7/0225 174/74 R |
| 12,057,414 | B2* | 8/2024 | Yamakaji | H05K 1/02 |
| 12,088,318 | B2* | 9/2024 | Watanabe | H04B 3/548 |
| 12,143,168 | B2* | 11/2024 | Uematsu | H04B 3/46 |
| 12,224,742 | B2* | 2/2025 | Sawada | H03K 17/6871 |
| 12,230,917 | B2* | 2/2025 | Asano | H01R 12/91 |
| 2005/0219006 | A1* | 10/2005 | Suenaga | H04L 25/0272 333/5 |
| 2006/0115007 | A1* | 6/2006 | Karam | H04L 12/10 713/300 |
| 2007/0165345 | A1* | 7/2007 | Woo | H04B 3/44 361/56 |
| 2007/0187653 | A1* | 8/2007 | Takeda | C01G 41/006 252/301.36 |
| 2007/0296394 | A1* | 12/2007 | Landry | H04L 12/10 323/371 |
| 2008/0167845 | A1* | 7/2008 | Hirose | H01B 12/06 703/2 |
| 2011/0086600 | A1* | 4/2011 | Muhammad | H04B 1/0458 455/120 |
| 2011/0129037 | A1* | 6/2011 | Staszewski | H03F 3/193 375/316 |
| 2011/0130163 | A1* | 6/2011 | Saban | H04W 88/085 455/517 |
| 2012/0269101 | A1* | 10/2012 | Vexler | H04L 5/1423 370/276 |
| 2013/0321087 | A1* | 12/2013 | Lender, Jr. | H03F 3/21 330/296 |
| 2014/0258738 | A1* | 9/2014 | Greenwalt | G06F 1/3206 713/300 |
| 2014/0342491 | A1* | 11/2014 | Masuyama | G02B 6/131 438/69 |
| 2015/0011123 | A1* | 1/2015 | Takata | B60L 58/12 439/620.01 |
| 2015/0065039 | A1* | 3/2015 | Nii | H01F 38/14 455/41.1 |
| 2015/0270696 | A1* | 9/2015 | Wakabayashi | H02G 3/0468 174/72 A |
| 2015/0318599 | A1* | 11/2015 | Ivanov | H01P 5/085 375/296 |
| 2016/0054777 | A1* | 2/2016 | Dwelley | G06F 1/3287 710/110 |
| 2016/0187951 | A1* | 6/2016 | Buckmeier | H01R 13/6633 713/300 |
| 2017/0041044 | A1* | 2/2017 | Ivanov | H04B 3/28 |
| 2017/0072991 | A1* | 3/2017 | Hayashi | B62D 5/049 |
| 2017/0093449 | A1* | 3/2017 | Zhu | H03F 3/45179 |
| 2017/0141542 | A1* | 5/2017 | Yoshinaga | H01S 5/04256 |
| 2017/0164528 | A1* | 6/2017 | Wakabayashi | H05K 1/0228 |
| 2017/0170627 | A1* | 6/2017 | Furuya | H01S 5/0233 |
| 2017/0291640 | A1* | 10/2017 | Fujita | G01D 5/14 |
| 2017/0331430 | A1* | 11/2017 | Anand | H03B 5/1212 |
| 2017/0345560 | A1* | 11/2017 | Tomonari | H05K 1/111 |
| 2018/0145716 | A1* | 5/2018 | Saito | H04B 15/04 |
| 2018/0272693 | A1* | 9/2018 | Hayashi | B41J 2/04581 |
| 2018/0294074 | A1* | 10/2018 | Tanaka | H01B 3/441 |
| 2018/0309083 | A1* | 10/2018 | Hayashi | H10K 50/10 |
| 2018/0371221 | A1* | 12/2018 | Yanagawa | H01B 3/447 |
| 2018/0375114 | A1* | 12/2018 | Higashino | C01G 25/02 |
| 2019/0152524 | A1* | 5/2019 | Fujita | G01D 5/145 |
| 2019/0222437 | A1* | 7/2019 | Iwata | H04L 12/403 |
| 2019/0229948 | A1* | 7/2019 | Iwata | B60L 15/42 |
| 2019/0308569 | A1* | 10/2019 | Ashibe | B60R 16/02 |
| 2019/0352800 | A1* | 11/2019 | Ishikawa | H10D 62/85 |
| 2019/0385057 | A1* | 12/2019 | Litichever | H04L 63/14 |
| 2019/0386630 | A1* | 12/2019 | Higuchi | H03H 7/09 |
| 2020/0041381 | A1* | 2/2020 | Inagaki | G05B 19/406 |
| 2020/0172028 | A1* | 6/2020 | Kawauchi | H04L 25/0276 |
| 2020/0313724 | A1* | 10/2020 | Mashita | H03H 7/0138 |
| 2020/0335622 | A1* | 10/2020 | Hiyoshi | H10D 30/669 |
| 2021/0293083 | A1* | 9/2021 | Tarng | F24H 11/89 |
| 2022/0190874 | A1* | 6/2022 | Uematsu | H04L 25/03885 |
| 2023/0112105 | A1* | 4/2023 | Park | H01R 24/50 439/581 |
| 2023/0119130 | A1* | 4/2023 | Watanabe | H04L 25/02 341/150 |
| 2023/0147803 | A1* | 5/2023 | Doynov | G01R 31/327 361/56 |
| 2023/0216540 | A1* | 7/2023 | Uematsu | H04B 3/46 375/257 |
| 2023/0238942 | A1* | 7/2023 | Kobayashi | H04B 3/50 327/552 |
| 2024/0014536 | A1* | 1/2024 | Takahashi | H05K 3/38 |
| 2024/0187289 | A1* | 6/2024 | Mashita | H05K 1/148 |
| 2024/0188239 | A1* | 6/2024 | Mashita | H04L 25/02 |

(56) References Cited

U.S. PATENT DOCUMENTS

| | | |
|---|---|---|
| 2024/0194617 A1* | 6/2024 | Yamakaji ................. H05K 1/18 |
| 2024/0235900 A1* | 7/2024 | Wachi ................. H05K 1/0245 |
| 2024/0381541 A1* | 11/2024 | Harrigan ................ H05K 3/341 |
| 2025/0007219 A1* | 1/2025 | Miyajo ................ H01R 12/722 |
| 2025/0015797 A1* | 1/2025 | Sawada ................ H03K 17/687 |

* cited by examiner

COMMUNICATOR AND COMMUNICATION DEVICE

CROSS-REFERENCE TO RELATED APPLICATIONS

This application is the U.S. national stage of PCT/JP2022/011518 filed on Mar. 15, 2022, which claims priority of Japanese Patent Application No. JP 2021-058104 filed on Mar. 30, 2021 and Japanese Patent Application No. 2021-096006 filed on Jun. 8, 2021, the contents of which are incorporated herein.

TECHNICAL FIELD

The present disclosure relates to a communicator and a communication device.

BACKGROUND

The communicator for a vehicle described in JP 2020-167536A receives a differential signal expressed by a voltage difference of two electrical signals that propagate via two conducting wires. With the communicator, using the potential of a first conductor as a reference potential, noise is removed from the two electrical signals. Also, the differential signal expressed by the voltage difference of the two electrical signals with the noise removed is converted to a voltage signal expressed by a voltage with the reference potential corresponding to the potential of a second conductor. The first conductor and the second conductor are disposed inside a single substrate. On one substrate of the substrate, a plurality of circuit elements required for noise removal and conversion are disposed.

In the communicator according to JP 2020-167536A, a plurality of circuit elements are disposed on one substrate. Thus, the area of the installation surface of the communicator is large. The communicator is installed in vehicles of various types with different shapes. In some cases, a communicator with a small area for the installation surface may be preferable.

An object is to provide a communicator and a communication device that can implement a reduction in the area of an installation surface.

SUMMARY

A communicator according to an aspect of the present disclosure is a communicator for receiving a differential signal that is a voltage difference between two electrical signals that propagate through two respective conducting wires, including: a noise removal circuit configured to remove noise from the two electrical signals using a potential of a first conductor as a reference potential; a conversion unit configured to convert a differential signal that is a voltage difference between two electrical signals with noise removed by the noise removal circuit into a voltage signal that is a voltage with a reference potential corresponding to a potential of a second conductor; a first substrate on which the first conductor is disposed; a second substrate on which the second conductor is disposed; and a substrate connector with flexibility that connects the first substrate and the second substrate.

A communication device according to an aspect of the present disclosure includes: a communicator that receives a differential signal expressed by a voltage difference of two electrical signals that propagate along two conducting wires; and a power supply apparatus that supplies power to the communicator, wherein the communicator includes a noise removal circuit that removes noise from the two electrical signals using a potential of a first conductor as a reference potential, a conversion unit that converts a differential signal expressed by a voltage difference of two electrical signals with noise removed by the noise removal circuit into a voltage signal expressed by a voltage with a reference potential corresponding to a potential of a second conductor, a first substrate where the first conductor is disposed, a second substrate where the second conductor is disposed, a substrate connector with flexibility that connects the first substrate and the second substrate, and an apparatus connector that connects the second substrate and a power supply apparatus, and the power supply apparatus supplies power to the conversion unit via the apparatus connector.

Advantageous Effects

According to the present disclosure, a reduction in the area of an installation surface can be implemented.

DETAILED DESCRIPTION OF PREFERRED EMBODIMENTS

Figure 1:
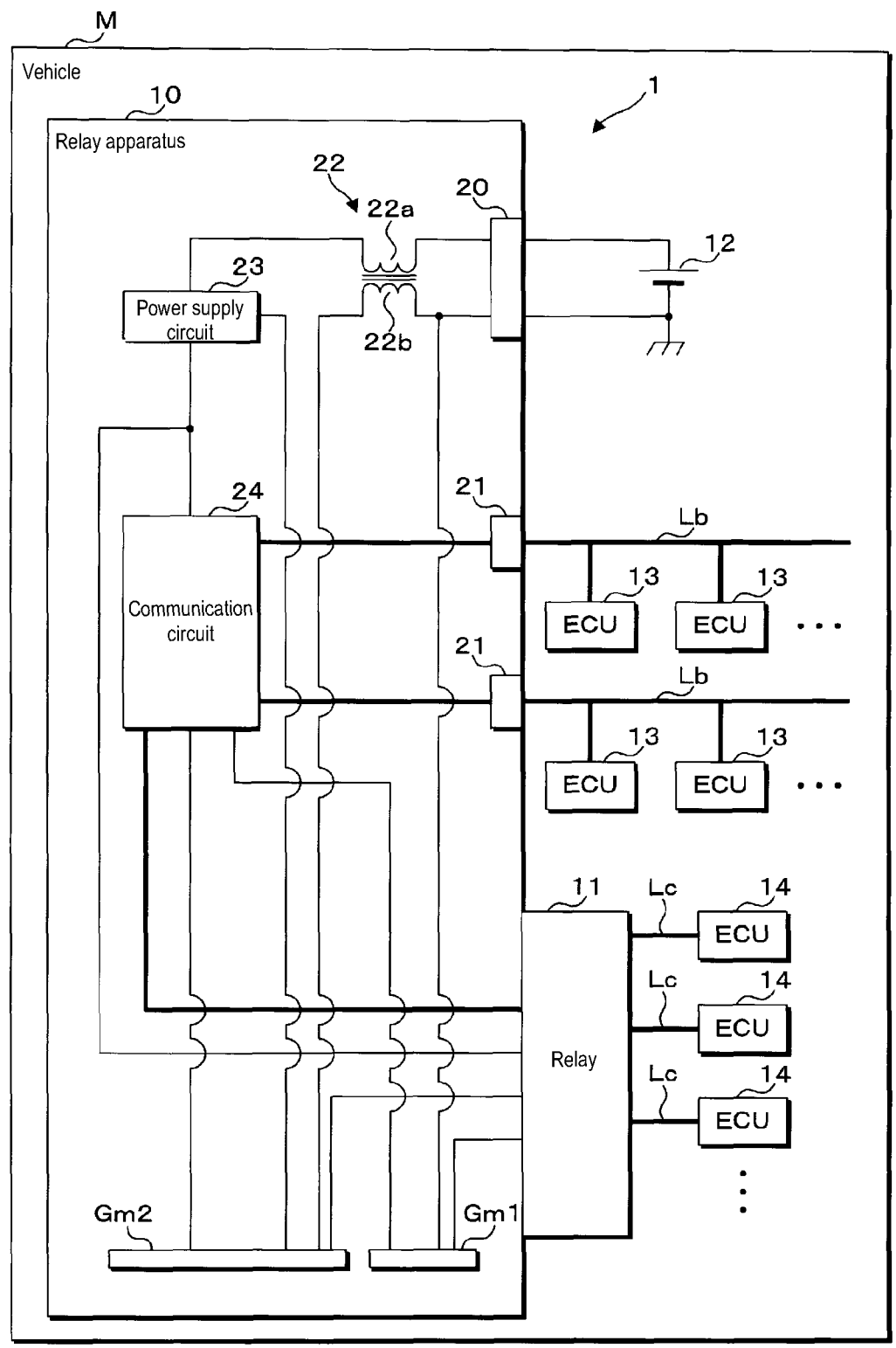
FIG. 1 is a block diagram illustrating the configuration of a main portion of a communication system according to a first embodiment.

Firstly, embodiments of the present disclosure will be listed and described. One or more parts of the embodiments described below may be combined in a discretionary manner.

A communicator according to an aspect of the present disclosure is a communicator for receiving a differential signal that is a voltage difference between two electrical signals that propagate through two respective conducting wires, including: a noise removal circuit configured to remove noise from the two electrical signals using a potential of a first conductor as a reference potential; a conversion unit configured to convert a differential signal that is a voltage difference between two electrical signals with noise removed by the noise removal circuit into a voltage signal that is a voltage with a reference potential corresponding to a potential of a second conductor; a first substrate on which the first conductor is disposed; a second substrate on which the second conductor is disposed; and a substrate connector with flexibility that connects the first substrate and the second substrate.

According to the aspect described above, the first substrate and the second substrate are connected via the substrate connector which is flexible. Thus, the flexibility relating to how to arrange the first substrate and the second substrate is high. Accordingly, the first substrate and the second substrate can be arranged so that the area of the installation surface is reduced.

In the communicator according to an aspect of the present disclosure, the differential signal is a signal for communication compliant with an Ethernet (registered trademark) communication protocol, a signal for communication using low voltage differential signalling (LVDS), or a signal for communication compliant with universal serial bus (USB).

According to the aspect described above, a signal for communication compliant with the Ethernet communication protocol, a signal for communication using LVDS, or a signal for communication compliant with USB is received.

The communicator according to an aspect of the present disclosure further includes a conductor connecting element connected between the first conductor and the second conductor, wherein the conductor connecting element is an inductor, a resistor, or a conducting wire.

According to the aspect described above, when noise enters the first conductor, even when the potential of the first conductor fluctuates, there is little effect on the voltage or electrical signal with the reference potential corresponding to the potential of the second conductor. In a similar manner, when noise enters the second conductor, even when the potential of the second conductor fluctuates, there is little effect on the voltage or electrical signal with the reference potential corresponding to the potential of the first conductor.

In the communicator according to an aspect of the present disclosure, a first circuit element is disposed on a surface of the first substrate, a second circuit element is disposed on a surface of the second substrate, and the surface of the first substrate on which the first circuit element is disposed faces the surface of the second substrate on which the second circuit element is disposed.

According to the aspect described above, by making one surface of the first substrate and one surface of the second substrate face one another, the area of the installation surface is reduced.

In the communicator according to an aspect of the present disclosure, a first circuit element is disposed on a surface of the first substrate, a second circuit element is disposed on a surface of the second substrate, and the surface of the first substrate on which the first circuit element is disposed and the surface of the second substrate on which the second circuit element is disposed are perpendicular to one another.

According to the aspect described above, the first substrate and the second substrate are disposed so that one surface of the first substrate and one surface of the second substrate are perpendicular to one another, thus reducing the area of the installation surface.

The communicator according to an aspect of the present disclosure further includes a box with electrical conductivity that houses the first substrate and the second substrate; and a projection portion projecting outward from the box, the projection portion being used for fixing the box, wherein the projection portion has electrical conductivity and is conductively connected to the first conductor via the box.

According to the aspect described above, the projection portion is connected to the substrate via soldering, for example. Accordingly, the projection portion can be conductively connected to the conductor disposed on the substrate. In this case, the first conductor is conductively connected to the conductor of the substrate via the box and the projection portion.

In the communicator according to an aspect of the present disclosure, the projection portion is provided with a through hole through which a screw with electrical conductivity is inserted, the box is fixed by the screw being tightened, and when the box is fixed, the screw is conductively connected to the projection portion.

According to the aspect described above, the screw is passed through the through hole of the projection portion. Thereafter, the screw is tightened on the substrate, for example. Accordingly, the screw is brought into contact with the projection portion with electrical conductivity, and the box is fixed to the substrate. For example, the screw is conductively connected to the conductor inside the substrate. In this case, the first conductor is conductively connected to the conductor of the substrate via the box, the projection portion, and the screw.

The communicator according to an aspect of the present disclosure further includes a second projection portion with electrical conductivity that projects outward from the box, the second projection portion being used for fixing the box, wherein the box includes a first conductive portion with electrical conductivity conductively connected to the first conductor, a second conductive portion with electrical conductivity conductively connected to the second conductor, and a connection portion with electrical conductivity that connects the first conductive portion and the second conductive portion, the projection portion projects from the first conductive portion, and the second projection portion projects from the second conductive portion.

According to the aspect described above, regarding the box, the first conductive portion is connected to the second conductive portion via the connection portion with insulating properties. The projection portion and the second projection portion can be conductively connected to the two conductors.

The communicator according to an aspect of the present disclosure further includes a conductive rod with electrical conductivity, wherein the first substrate is provided with an insertion hole through which the conductive rod is inserted, and the conductive rod is inserted into the insertion hole and conductively connected to the first conductor.

According to the aspect described above, the conductive rod is inserted into the insertion hole of the first substrate. The conductive rod is inserted into the insertion hole of the substrate of another apparatus, for example. In the two insertion holes, the conductive rods are connected to the first substrate and the substrate of another apparatus via soldering, for example. Accordingly, the first conductor of the first substrate is conductively connected to the conductor of the substrate via the conductive rod.

The communicator according to an aspect of the present disclosure further includes an apparatus connector that connects the second substrate and an external apparatus, wherein the conversion unit is supplied with power via the apparatus connector.

According to the aspect described above, power is supplied to the conversion unit from an external apparatus via the apparatus connector.

In the communicator according to an aspect of the present disclosure, the apparatus connector includes a second conductive rod with electrical conductivity, and the second substrate is provided with a second insertion hole through which the second conductive rod is inserted.

According to the aspect described above, the second conductive rod is connected to an external apparatus and the conversion unit. Power is supplied to the conversion unit from an external apparatus via the second conductive rod.

In the communicator according to an aspect of the present disclosure, the apparatus connector is an edge connector that projects from the second substrate.

According to the aspect described above, the apparatus connector is inserted into a recess portion provided in an external apparatus. In this manner, the apparatus connector is connected to an external apparatus.

In the communicator according to an aspect of the present disclosure, the apparatus connector has a plate-like shape and flexibility, and an end portion of the apparatus connector is installed on the second substrate.

According to the aspect described above, the end portion of the apparatus connector is connected to an external apparatus. Since the apparatus connector has flexibility, the connection can be easily implemented.

The communicator according to an aspect of the present disclosure further includes a communication line connector connected to a communication line including two conducting wires, wherein the differential signal is input into the noise removal circuit via the communication line and the communication line connector.

According to the aspect described above, noise is removed from the two electrical signals forming the differential signal input via the communication line and the communication line connector.

In the communicator according to an aspect of the present disclosure, the communication line connector is an edge connector that projects from the first substrate.

According to the aspect described above, the communication line connector is inserted into a hole provided in a cable including the communication line, for example. In this manner, the communication line connector is connected to the communication line.

A communication device according to an aspect of the present disclosure includes: a communicator that receives a differential signal that is a voltage difference between two electrical signals that propagate through two respective conducting wires; and a power supply apparatus configured to supply power to the communicator, wherein the communicator includes a noise removal circuit configured to remove noise from the two electrical signals using a potential of a first conductor as a reference potential, a conversion unit configured to convert a differential signal that is a voltage difference between two electrical signals with noise removed by the noise removal circuit into a voltage signal that is a voltage with a reference potential corresponding to a potential of a second conductor, a first substrate on which the first conductor is disposed, a second substrate on which the second conductor is disposed, a substrate connector with flexibility that connects the first substrate and the second substrate, and an apparatus connector that connects the second substrate and a power supply apparatus, and the power supply apparatus supplies power to the conversion unit via the apparatus connector.

According to the aspect described above, the first substrate and the second substrate are connected via the substrate connector which is flexible. Thus, the flexibility relating to how to arrange the first sub substrate and the second sub substrate is high. Accordingly, the first substrate and the second substrate can be arranged so that the area of the installation surface of the communicator is reduced. When the area of the installation surface of the communicator is reduced, the area of the installation surface of the apparatus is also reduced.

In the communication device according to an aspect of the present disclosure, the power supply apparatus includes a first power supply conductor and a second power supply conductor, the first power supply conductor and the second power supply conductor are conductively connected to the first conductor and the second conductor, respectively, and the first power supply conductor and the second power supply conductor are connected via an inductor or a resistor.

According to the aspect described above, the first power supply conductor is conductively connected to the first conductor. Thus, the first power supply conductor and the first conductor are treated as one conductor. The second power supply conductor is conductively connected to the second conductor. Thus, the second power supply conductor and the second conductor are also treated as one conductor. The first power supply conductor and the second power supply conductor are connected via an inductor or a resistor. Accordingly, when noise enters the first power supply conductor, even when the potential of the first power supply conductor fluctuates, there is little effect on the voltage or electrical signal with the reference potential corresponding to the potential of the second power supply conductor. In a similar manner, when noise enters the second power supply conductor, even when the potential of the second power supply conductor fluctuates, there is little effect on the voltage or electrical signal with the reference potential corresponding to the potential of the first power supply conductor.

In the communication device according to an aspect of the present disclosure, the power supply apparatus includes a first power supply conductor and a second power supply conductor, the first power supply conductor and the second power supply conductor are conductively connected to the first conductor and the second conductor, respectively, and the first power supply conductor and the second power supply conductor are connected via a second conducting wire.

According to the aspect described above, the first power supply conductor is conductively connected to the first conductor. Thus, the first power supply conductor and the first conductor are treated as one conductor. The second power supply conductor is conductively connected to the second conductor. Thus, the second power supply conductor and the second conductor are also treated as one conductor. The first power supply conductor and the second power supply conductor are connected via the second conducting wire. The second conducting wire has a resistance component. Accordingly, when noise enters the first conductor, even when the potential of the first conductor fluctuates, there is little effect on the voltage or electrical signal with the reference potential corresponding to the potential of the second conductor. In a similar manner, when noise enters the second conductor, even when the potential of the second conductor fluctuates, there is little effect on the voltage or electrical signal with the reference potential corresponding to the potential of the first conductor.

The communication device according to an aspect of the present disclosure further includes an electrically connecting element that implements an electrical connection, wherein the two conducting wires pass through the substrate connector, the substrate connector includes a connection conductor that conductively connects the first conductor and the second conductor, and the electrically connecting element is connected between the connection conductor and the second conductor or between the first conductor and the connection conductor.

According to the aspect described above, the connection conductor is conductively connected to one of the first power supply conductor or the second power supply conductor. The connection conductor is connected to the other one of the first conductor or the second conductor. This prevents the connection conductor from functioning as an antenna that converts the electromagnetic waves propagating through the air into a current. For example, when the connection conductor is insulated from the other one of the first conductor or the second conductor, there is a possibility that the connection conductor functions as an antenna that converts electromagnetic waves propagating through the air into a current. There is a possibility that the converted current acts as noise.

In the communication device according to an aspect of the present disclosure, the communicator transmits data included in a voltage signal converted by the conversion unit to the power supply apparatus via the apparatus connector.

According to the aspect described above, the power supply apparatus receives data from the communicator.

A specific example of a communication system according to an embodiment of the present disclosure will be described with reference to the drawings. Note that the present disclosure is not limited to these examples and is defined by the scope of the claims, and all modifications that are equivalent to or within the scope of the claims are included.

First Embodiment

Communication System Configuration

FIG. 1 is a block diagram illustrating the configuration of a main portion of a communication system 1 according to the first embodiment. The communication system 1 is installed in a vehicle M. The communication system 1 includes a relay apparatus 10, a relay 11, a DC power supply 12, and a plurality of ECUs (Electronic Control Units) 13 and 14. The DC power supply 12 is a battery, for example. The relay apparatus 10 includes a power supply connector 20 and two bus connectors 21. In FIG. 1, the signal lines along which signals propagate are indicated by thick lines. Wiring lines other than these signal lines are indicated by thin lines.

A positive electrode and a negative electrode of the DC power supply 12 are separately connected to the power supply connector 20 of the relay apparatus 10. The negative electrode of the DC power supply 12 is also connected to a ground. Grounding is implemented by connecting to the body of the vehicle M, for example. A communication bus Lb is connected to each one of the two bus connectors 21 of the relay apparatus 10. The plurality of ECUs 13 are connected to the communication buses Lb. The relay 11 is connected to the relay apparatus 10. The relay 11 is connected to each one of the plurality of ECUs 14 by communication lines Lc.

The DC power supply 12 supplies power to the relay apparatus 10. The relay apparatus 10 is an ECU, for example. The relay apparatus 10 supplies power to the relay 11. The relay apparatus 10 functions as a power supply apparatus. The relay apparatus 10 and the relay 11 executes various types of processing using the supplied power. The relay apparatus 10 and the ECUs 13 transmit differential signals including data via the communication buses Lb. Differential signal transmission corresponds to data transmission. The communication bus Lb includes two conducting wires. The differential signal is expressed by a voltage difference of two electrical signals that propagate via the two conducting wires. The differential signal transmitted via the communication bus Lb is received by all of the apparatuses connected to the communication bus Lb.

Each ECU 13 and 14 is connected to a non-illustrated actuator and sensor. Each ECU 13 and 14 obtain a detection result from the sensor. Each ECU 13 and 14 outputs an actuation signal to the actuator. The actuation signal indicates the operation of the actuator. When the actuator is input with an actuation signal, the operation indicated by the input actuation signal is executed. Each ECU 13 and 14 controls the operation of the actuator by outputting an actuation signal to the actuator. The actuator may be a door motor for locking or unlocking a door, a wiper motor for swinging the wipers, a lamp, or the like.

When the ECU 13 receives a differential signal via the communication bus Lb, the ECU 13 determines whether or not it is the transmission destination of the data included in the received differential signal. When the ECU 13 determines that it is the transmission destination of the data, the ECU 13 controls the operation of the actuator on the basis of the data of the received differential signal. For example, the ECU 13 transmits a differential signal including data indicating the detection result from a sensor via the communication bus Lb. The transmission destination of the data included in the differential signal is one of the ECUs 13 different from the transmission source or one of the ECUs 14.

When the relay apparatus 10 receives a differential signal via the communication bus Lb, the relay apparatus 10 determines whether or not to relay the data transmission on the basis of the transmission destination of the data included in the differential signal received. When the relay apparatus 10 determines to relay the data transmission, the relay apparatus 10 executes at least one of two types of processing. The first processing is transmitting the differential signal via one of the communication buses Lb different from the communication bus Lb used to receive the differential signal. The second processing is transmitting a voltage signal including the data to the relay 11. A voltage signal is a signal expressed by a voltage with the reference potential corresponding to the potential of a conductor. Voltage signal transmission also corresponds to data transmission.

When the relay 11 receives a voltage signal from the relay apparatus 10, the relay 11 generates a differential signal including the data of the received voltage signal. The relay 11 transmits the generated differential signal to the ECUs 14 via the communication lines Lc. As with the communication bus Lb, the communication line Lc includes two conducting wires Wa and Wb (see FIG. 3). The differential signal is expressed by a voltage difference of two electrical signals that propagate via each of the two conducting wires Wa and Wb.

For example, the ECU 14 transmits a differential signal including data indicating the detection result from a sensor to the relay 11 via the communication line Lc. The transmission destination of the data included in the differential signal is one of the ECUs 13 or one of the ECUs 14 different from the transmission source. The relay 11 receives the differential signal. The relay 11 functions as a communicator. The apparatus including the relay apparatus 10 and the relay 11 functions as a communication device.

When the relay 11 receives a differential signal from the ECU 14 and the transmission destination of the data included in the received differential signal is one of the ECUs 14 different from the transmission source, the relay 11 transmits the differential signal including the data to the ECU 14 which is the transmission destination.

When the ECU 14 receives the differential signal via the communication line Lc, the ECU 14 controls the actuator on the basis of the data included in the received differential signal.

When the relay 11 receives a differential signal from the ECU 14 and the transmission destination of the data included in the received differential signal is one of the ECUs 13, the relay 11 transmits a voltage signal including the data of the received differential signal to the relay apparatus 10. When the relay apparatus 10 receives the voltage signal from the relay 11, the relay apparatus 10 transmits the differential signal including the data of the received voltage signal to the ECUs 13 via the communication buses Lb.

In this manner, the relay apparatus 10 relays data communication between two of the ECUs 13 connected to two different communication buses Lb. The relay 11 relays data communication between two ECUs 14. The relay apparatus 10 and the relay 11 relay communication between the ECUs 13 and 14.

Communication via the communication buses Lb are performed according to the CAN (Controller Area Network) communication protocol, for example. Communication via the communication buses Lc is performed according to the Ethernet (registered trademark) communication protocol, for example.

Relay Apparatus 10 Configuration

In addition to the power supply connector 20 and the two bus connectors 21, the relay apparatus 10 also includes a common mode choke coil 22, a power supply circuit 23, a communication circuit 24, a first main conductor Gm1, and a second main conductor Gm2. The common mode choke coil 22 includes a first inductor 22*a*, a second inductor 22*b*, and a non-illustrated annular magnetic body. The first inductor 22*a* and the second inductor 22*b* are wound around the magnetic body. The potential of the first main conductor Gm1 and the potential of the second main conductor Gm2 function as grounds. The first main conductor Gm1 functions as a first power supply conductor. The second main conductor Gm2 functions as a second power supply conductor.

One end of the first inductor 22*a* and one end of the second inductor 22*b* are separately connected to the power supply connector 20. The connection node between the second inductor 22*b* and the power supply connector 20 is connected to the first main conductor Gm1. The other end of the first inductor 22*a* is connected to the power supply circuit 23. The other end of the second inductor 22*b* and the power supply circuit 23 are separately connected to the second main conductor Gm2.

As described above, the second inductor 22*b* is connected to the first main conductor Gm1 and the second main conductor Gm2. The circuit element connecting the first main conductor Gm1 and the second main conductor Gm2 is not limited to the second inductor 22*b* and may be a resistor, for example. In this case, the power supply connector 20 is connected to the power supply circuit 23 bypassing the first inductor 22*a*.

The power supply circuit 23 is further connected to the relay 11 and the communication circuit 24. The communication circuit 24 is further separately connected to the relay 11, the two bus connectors 21, the first main conductor Gm1, and the second main conductor Gm2. The first main conductor Gm1 and the second main conductor Gm2 are separately connected to the relay 11.

The voltage with the reference potential corresponding to the potential of the first main conductor Gm1 is applied from the DC power supply 12 to one end of the first inductor 22*a* and one end of the second inductor 22*b* of the common mode choke coil 22. The common mode choke coil 22 removes common mode noise from the applied voltage. Common mode noise is noise that is superpositioned in-phase in the two conducting wires connected to the ends of the first inductor 22*a* and the second inductor 22*b*.

The common mode choke coil 22 applies the voltage with common mode noise removed from the other end of the first inductor 22*a* to the power supply circuit 23. As described above, the other end of the second inductor 22*b* and the power supply circuit 23 are connected to the second main conductor Gm2. Thus, the voltage applied by the common mode choke coil 22 to the power supply circuit 23 is the voltage with the reference potential corresponding to the potential of the second main conductor Gm2.

The power supply circuit 23 decreases the voltage applied from the common mode choke coil 22 to a constant voltage such as 5V, 3.3 V, or the like. The power supply circuit 23 applies the constant voltage generated by decreasing the voltage to the relay 11 and the communication circuit 24. Thus, the relay 11 and the communication circuit 24 are supplied with power. The reference potential of the constant voltage is the potential of the second main conductor Gm2.

When the communication circuit 24 receives a differential signal via the communication buses Lb, the communication circuit 24 removes the noise from the two electrical signals forming the received differential signal using the potential of the first main conductor Gm1 as the reference potential. The communication circuit 24 converts the differential signal expressed by the voltage difference of the two electrical signals with the noise removed to a voltage signal with the reference potential corresponding to the potential of the second main conductor Gm2. The communication circuit 24 obtains the data included in the converted voltage signal.

The communication circuit 24 determines whether or not to relay the data transmission on the basis of the transmission destination of the obtained data. When the communication circuit 24 determines to relay the data transmission, the communication circuit 24 executes at least one of the two types of processing described above. As described above, the first processing is transmitting the differential signal via one of the communication buses Lb different from the communication bus Lb used to receive the differential signal. The second processing is transmitting a voltage signal including the data to the relay 11.

In the first processing, the communication circuit 24 generates a differential signal including the obtained data and transmits the generated differential signal via the communication bus Lb different from the communication bus Lb used to receive the differential signal. In the second processing, the communication circuit 24 transmits the voltage signal indicating the obtained data to the relay 11. As described above, when the relay 11 receives a voltage signal from the communication circuit 24, the relay 11 generates a differential signal including the data of the received voltage signal. The relay 11 transmits the generated differential signal to the ECUs 14.

As described above, the communication circuit 24 executes processing of the electrical signal with the potential of the first main conductor Gm1 corresponding to the reference potential and processing of the electrical signal with the potential of the second main conductor Gm2 corresponding to the reference potential.

As described above, the relay apparatus 10 includes the first main conductor Gm1 and the second main conductor Gm2. When noise enters the first main conductor Gm1, even when the potential of the first main conductor Gm1 fluctuates, there is little effect on the voltage or electrical signal with the reference potential corresponding to the potential of the second main conductor Gm2. In a similar manner, when noise enters the second main conductor Gm2, even when the potential of the second main conductor Gm2 fluctuates, there is little effect on the voltage or signal with the reference potential corresponding to the potential of the first main conductor Gm1.

Note that the number of ECUs 13 connected to one communication bus Lb may be one. Also, the number of communication buses Lb connected to the relay apparatus 10 is not limited to two and may be one or three or more. The number of bus connectors 21 included in the relay apparatus 10 is adjusted to the same number as the number of communication buses Lb. When the number of communication buses Lb is 1, the relay apparatus 10 does not relay communication between two ECUs 13.

Relay 11 Configuration

Figure 2:
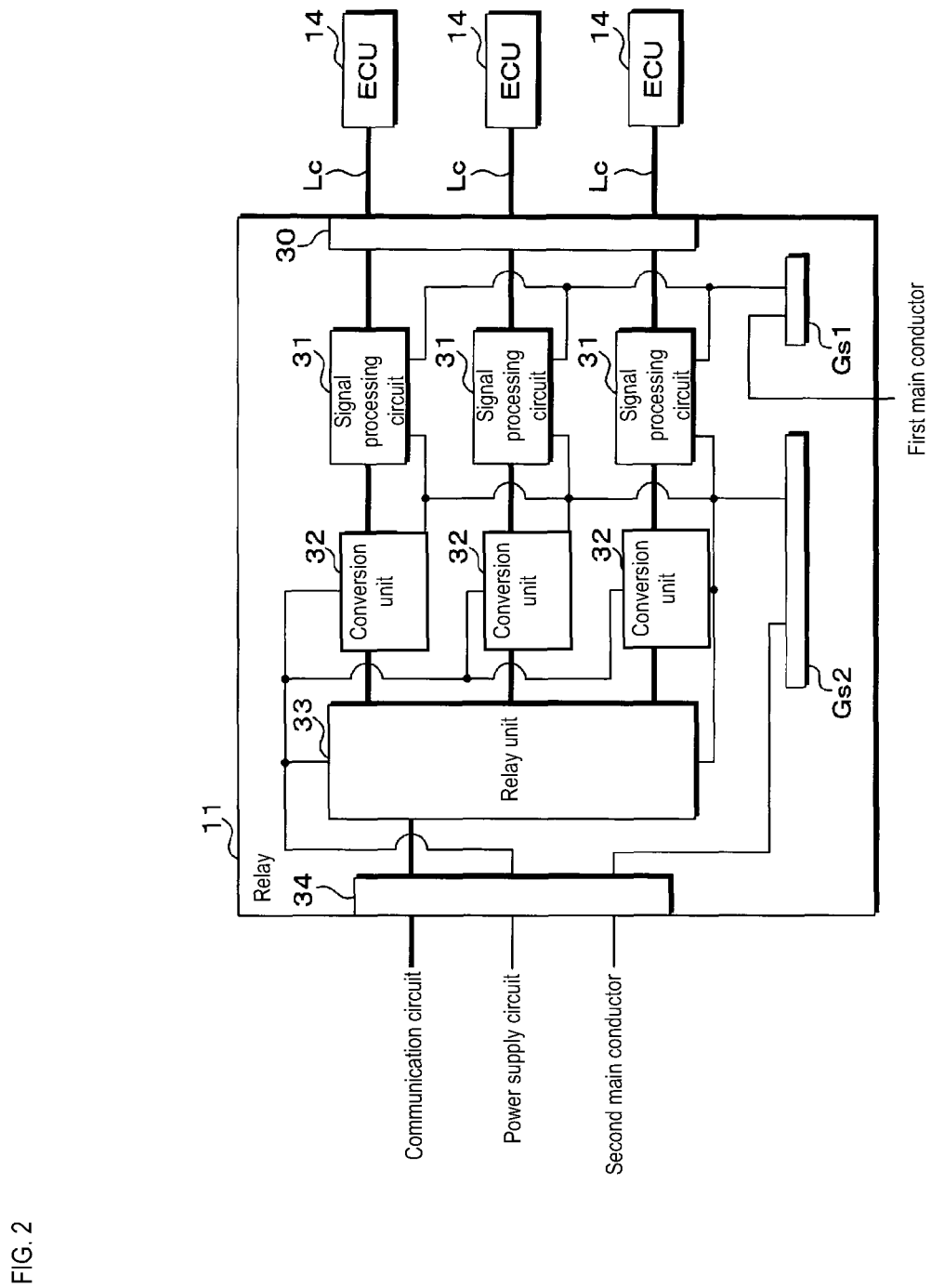
FIG. 2 is a block diagram illustrating the configuration of a main portion of a relay.

FIG. 2 is a block diagram illustrating the configuration of a main portion of the relay 11. In the example illustrated in FIG. 2, the number of ECUs 14 is three. It is sufficient that the number of ECUs 14 connected to the relay 11 is one or more. Thus, the number of ECUs 14 is not limited to three. As with FIG. 1, in FIG. 2, the signal lines are indicated by thick lines. Wiring lines other than these signal lines are indicated by thin lines.

As illustrated in FIG. 2, the relay 11 includes a communication line connector 30, three signal processing circuits 31, three conversion units 32, a relay unit 33, an apparatus connector 34, a first sub conductor Gs1, and a second sub conductor Gs2. One end of each of the three communication lines Lc is separately connected to the communication line connector 30. As described above, the communication line Lc includes the two conducting wires Wa and Wb. The other end of each of the communication lines Lc is connected to one of the ECUs 14. The potential of the first sub conductor Gs1 and the potential of the second sub conductor Gs2 function as grounds.

The communication line connector 30 is separately connected to the three signal processing circuits 31. The three signal processing circuits 31 are connected to the three conversion units 32, respectively. The three conversion units 32 are further separately connected to the relay unit 33. The three conversion units 32 and the relay unit 33 are further connected to the apparatus connector 34. The apparatus connector 34 is further connected to the second sub conductor Gs2. The three signal processing circuits 31 are each separately connected to the first sub conductor Gs1 and the second sub conductor Gs2. The three conversion units 32 and the relay unit 33 are further connected to the second sub conductor Gs2.

As described above, the relay apparatus 10 includes the power supply circuit 23, the communication circuit 24, the first main conductor Gm1, and the second main conductor Gm2. The communication circuit 24 is connected to the relay unit 33 via the apparatus connector 34. The power supply circuit 23 is connected to the three conversion units 32 and the relay unit 33 via the apparatus connector 34. The second main conductor Gm2 is connected to the second sub conductor Gs2 via the apparatus connector 34. The first main conductor Gm1 is connected to the first sub conductor Gs1 bypassing the apparatus connector 34.

Note that the number of the signal processing circuits 31 and the number of the conversion units 32 are the same as the number of the ECUs 14. Thus, when the number of ECUs 14 changes, the number of the signal processing circuits 31 and the number of the conversion units 32 is adjusted to the same number as the number of ECUs 14.

As described above, the power supply circuit 23 applies a constant voltage with the reference potential corresponding to the potential of the second main conductor Gm2 to the relay 11. The second main conductor Gm2 is connected to the second sub conductor Gs2. The potential of the second main conductor Gm2 is the same as the potential of the second sub conductor Gs2. The power supply circuit 23 applies a constant voltage with the reference potential corresponding to the potential of the second sub conductor Gs2 to the conversion units 32 and the relay unit 33. Thus, the conversion units 32 and the relay unit 33 are supplied with power.

As described above, the ECU 14 transmits a differential signal via the communication line Lc. In the relay 11, the differential signal is input to the signal processing circuit 31 via the communication line Lc and the communication line connector 30. The signal processing circuit 31 removes noise from the two electrical signals forming the differential signal input via the communication line Lc and the communication line connector 30 using the potential of the first sub conductor Gs1 as the reference potential. In this example, the removed noise is electrostatic noise superpositioned on the signal when static electricity occurs, for example. When electrostatic noise is superpositioned on an electrical signal, the voltage of the electrical signal greatly increases temporarily. The first sub conductor Gs1 functions as a first conductor. The signal processing circuit 31 functions as a noise removal circuits.

The signal processing circuit 31 removes the common mode noise from the differential signal formed from two electrical signals with noise removed. Common mode noise is noise that is superposition in-phase in the two conducting wires forming the communication line Lc. The signal processing circuit 31 removes noise from the two electrical signals forming the differential signal with the common mode noise removed using the potential of the second sub conductor Gs2 as the reference potential. In this example, the removed noise is electrostatic noise, for example.

The signal processing circuit 31 outputs the differential signal expressed by the voltage difference of the two electrical signals with noise removed to the conversion unit 32. In this manner, the conversion unit 32 receives the differential signal. The conversion unit 32 converts the received differential signal into a voltage signal expressed by a voltage with the reference potential corresponding to the potential of the second sub conductor Gs2. The second sub conductor Gs2 functions as a second conductor. The conversion unit 32 outputs the converted voltage signal to the relay unit 33. The relay unit 33 obtains the data included in the input voltage signal.

When the transmission destination of the obtained data is one of the ECUs 13, the relay unit 33 generates a voltage signal included the obtained data. In this example, the reference potential of the voltage signal is the potential of the second sub conductor Gs2 (second main conductor Gm2). The relay unit 33 transmits the generated voltage signal to the communication circuit 24 via the apparatus connector 34. In this manner, the communication circuit 24 receives the data from the relay unit 33.

When the transmission destination of the obtained data is one of the ECUs 14, the relay unit 33 generates a voltage signal included the obtained data. In this example also, the reference potential of the voltage signal is the potential of the second sub conductor Gs2. The relay unit 33 outputs the generated voltage signal to the conversion unit 32.

The communication circuit 24 transmits the voltage signal with the reference potential corresponding to the potential of the second main conductor Gm2 (second sub conductor Gs2) to the relay unit 33. When the relay unit 33 receives the voltage signal, the relay unit 33 obtains the data of the received voltage signal. The relay unit 33 generates a voltage signal including the obtained data and outputs the generated voltage signal to the conversion unit 32. The relay unit 33 including an integrated circuit element, for example.

When the conversion unit 32 is input with the voltage signal from the relay unit 33, the conversion unit 32 converts the input voltage signal into a differential signal. The conversion unit 32 transmits the converted differential signal to the ECU 14 via the signal processing circuit 31 and the communication line connector 30.

As described above, at the relay 11, processing of the electrical signal with the potential of the first sub conductor Gs1 corresponding to the reference potential and processing of the electrical signal with the potential of the second sub conductor Gs2 corresponding to the reference potential are executed.

The differential signal transmitted via the communication line Lc is, for example, a signal for communication compliant with the Ethernet communication protocol, a signal for communication using LVDS (Low Voltage Differential Signalling), or a signal for communication compliant with USB (Universal Serial Bus).

In communication compliant with the Ethernet communication protocol, communication using LVDS, or communication compliant with USB, signals are transmitted and received using a P2P (peer-to-peer) format. Thus, a large amount of data can be transmitted per unit time. When the P2P (peer-to-peer) format is used, the number of ECUs 14 is difficult to increase when the ECUs 14 are directly connected to the relay apparatus. However, the relay 11 is connected to the relay apparatus 10. Thus, by substituting the current relay 11 with another relay 11, the number of ECUs 14 can be easily increased or decreased.

Communication compliant with the CAN (Controller Area Network) communication protocol is an example of the communication for transmitting the differential signal. With this communication, the ECUs are connected to the communication bus. Thus, the number of ECUs can be easily increased or decreased. However, since the P2P format is not being used, only a small amount of data can be transmitted per unit time.

When the ECUs 14 are directly connected to the relay apparatus, the number of ECUs 14 is difficult to increase or decrease after the relay apparatus is manufactured. Consider a case in which a sensor is newly installed in a vehicle after the relay apparatus is manufactured. In this case, there is a possibility of it being necessary to transmit the detection result from the sensor from one of the ECUs 14 to the ECUs 13 or another ECU 14. In this case, the number of ECUs 14 connected to the relay apparatus needs to be increased. However, since the ECUs 14 are directly connected to the relay apparatus, the relay apparatus needs to be newly manufactured.

However, in the communication system 1, the ECU 14 for transmitting the sensor detection value can be easily added by substituting the current relay 11 with another relay 11. Also, the relay 11 can be replaced. Accordingly, depending on the state of the vehicle M, the relay 11 can be attached to each one of the plurality of relay apparatuses 10 with different functions.

Signal Processing Circuit 31 Configuration

Figure 3:
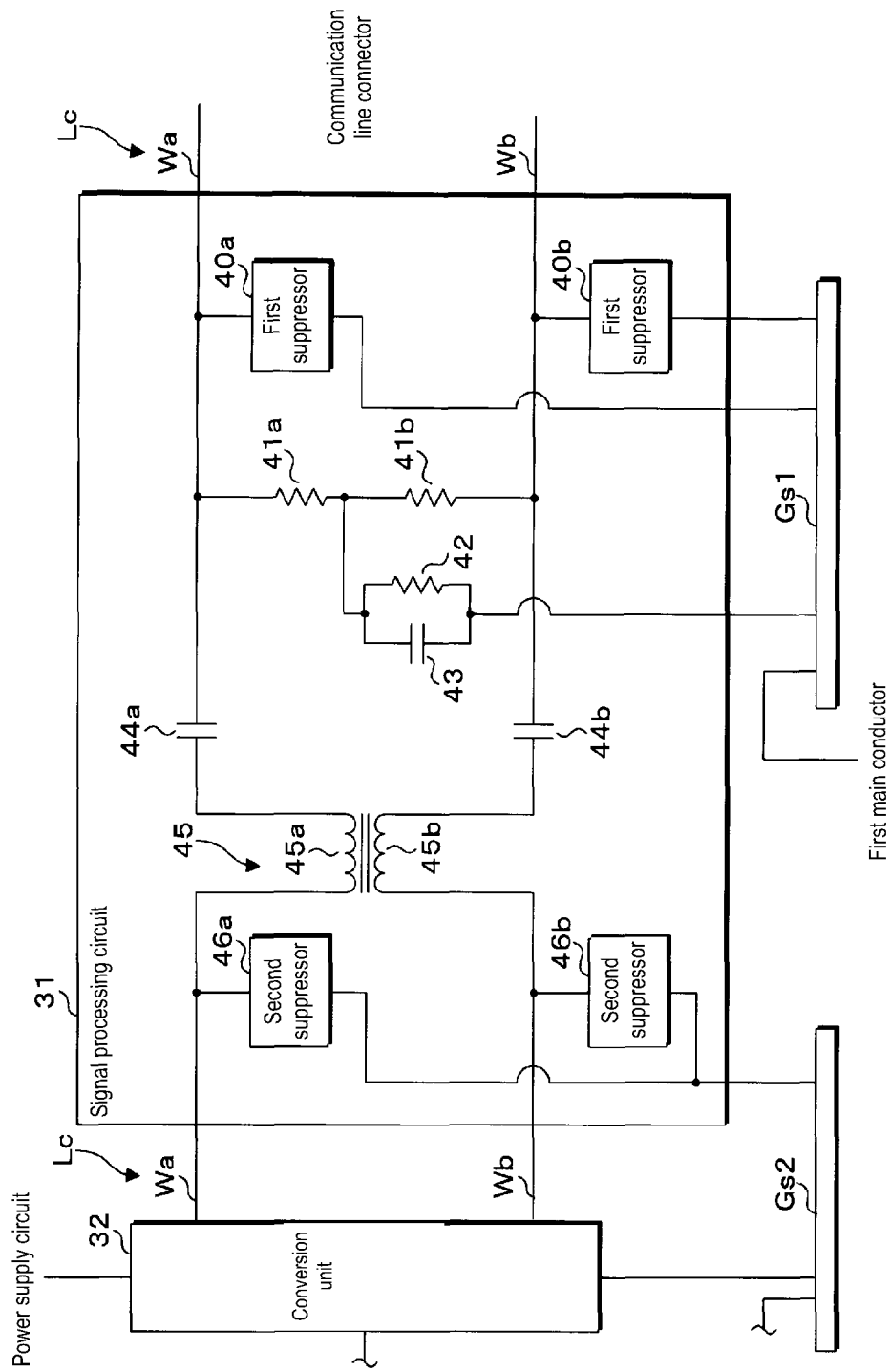
FIG. 3 is a circuit diagram of a signal processing circuit.

FIG. 3 is a circuit diagram of the signal processing circuit 31. The signal processing circuit 31 includes two first suppressors 40a and 40b, the resistors 41a, 41b, and 42, three capacitors 43, 44a, and 44b, a common mode choke coil 45, and two second suppressors 46a and 46b. The common mode choke coil 45 includes a first inductor 45a, a second inductor 45b, and an annular magnetic body. The first inductor 45a and the second inductor 45b are wound around the magnetic body.

As described above, the communication line Lc includes the two conducting wires Wa and Wb. The capacitor 44a and the first inductor 45a of the common mode choke coil 45 are disposed partway along the conducting wire Wa. The capacitor 44a is disposed on the communication line connector 30 side of the first inductor 45a. In a similar manner, the capacitor 44b and the second inductor 45b of the common mode choke coil 45 are disposed partway along the conducting wire Wb. The capacitor 44b is disposed on the communication line connector 30 side of the second inductor 45b.

On the communication line connector 30 side of the capacitor 44a, the first suppressor 40a and one end of the resistor 41a are connected to the conducting wire Wa. The connection point of the first suppressor 40a is located closer to the communication line connector 30 than the connection point of the resistor 41a. In a similar manner, on the communication line connector 30 side of the capacitor 44b, the first suppressor 40b and one end of the resistor 41b are connected to the conducting wire Wb. The connection point of the first suppressor 40b is located closer to the communication line connector 30 than the connection point of the resistor 41b.

The other end of the resistor 41a is connected to the other end of the resistor 41b. The connection node between the resistors 41a and 41b is connected to the resistor 42 and one end of the capacitor 43. The first suppressors 40a and 40b, the resistor 42, and the other end of the capacitor 43 are connected to the first sub conductor Gs1.

On the conversion unit 32 side of the first inductor 45a, one end of the second suppressor 46a is connected to the conducting wire Wa. In a similar manner, on the conversion unit 32 side of the second inductor 45b, one end of the second suppressor 46b is connected to the conducting wire Wb. The other ends of the second suppressors 46a and 46b are connected to the second sub conductor Gs2.

The first suppressors 40a and 40b each include a suppressor, a varistor, a capacitor, and the like. The first suppressors 40a and 40b each suppress the peak value of two electrical signals with the reference potential corresponding to the potential of the first sub conductor Gs1. As described above, there is a possibility that the peak value of the electrical signals greatly increases temporarily due to noise superposition. Electrostatic noise is removed from the electrical signals by suppressing the peak value. The two electrical signals propagate via each of the two conducting wires Wa and Wb. The first suppressors 40a and 40b each suppress the peak value of the two electrical signals forming the differential signal input from the communication line connector 30.

The resistors 41a, 41b, and 42 and the capacitor 43 function as a termination circuit and suppress reflection of the differential signal input from the communication line connector 30 side. The capacitors 44a and 44b each remove the direct current component of the two electrical signals forming the differential signal input from the communication line connector 30 side. The capacitors 44a and 44b output the differential signal expressed by the voltage difference of the two electrical signals with the direct current component removed to the common mode choke coil 45.

The common mode choke coil 45 removes the common mode noise from the differential signal output by the capacitors 44a and 44b and outputs a differential signal with the common mode noise removed to the conversion unit 32 side.

The second suppressors 46a and 46b each include a suppressor, a varistor, a capacitor, a Zener diode or diode clamp circuit, and the like. The second suppressors 46a and 46b each suppress the peak value of two electrical signals with the reference potential corresponding to the potential of the second sub conductor Gs2. In this manner, the noise is removed from the two electrical signals. The removed noise is electrostatic noise, for example. The two electrical signals propagate via each of the two conducting wires Wa and Wb. The second suppressors 46a and 46b each suppress the peak value of the two electrical signals forming the differential signal input from the common mode choke coil 45. The differential signal formed by the two electrical signals with the peak value suppressed is input into the conversion unit 32.

As described above, the conversion unit 32 transmits a differential signal via the communication line Lc. In this case, the second suppressors 46a and 46b each suppress the peak value of the two electrical signals forming the differential signal input from the conversion unit 32. In this manner, the noise is removed from the two electrical signals. The differential signal formed by the two electrical signals with the peak value suppressed is input into the common mode choke coil 45. The common mode choke coil 45 removes the common mode noise from the differential signal input from the conversion unit 32 side and outputs a differential signal with the common mode noise removed to the communication line connector 30 side.

The capacitors 44a and 44b each remove the direct current component of the two electrical signals forming the differential signal input from the conversion unit 32 side. The capacitors 44a and 44b output the differential signal expressed by the voltage difference of the two electrical signals with the direct current component removed to the communication line connector 30 side. The first suppressors 40a and 40b each suppress the peak value of the two electrical signals forming the differential signal output by the capacitors 44a and 44b. In this manner, the noise is removed from the two electrical signals. The differential signal formed by the two electrical signals with the peak value suppressed is output to the ECU 14 via the communication line connector 30.

As described above, the signal processing circuit 31, using the potential of the first sub conductor Gs1 as a reference potential, removes noise from the two electrical signals. The signal processing circuit 31, using the potential of the second sub conductor Gs2 as a reference potential, removes noise from the two electrical signals.

As described above, the relay 11 includes the first sub conductor Gs1 and the second sub conductor Gs2. When noise enters the first sub conductor Gs1, even when the potential of the first sub conductor Gs1 fluctuates, there is little effect on the voltage or signal with the reference potential corresponding to the potential of the second sub conductor Gs2. In a similar manner, when noise enters the second sub conductor Gs2, even when the potential of the second sub conductor Gs2 fluctuates, there is little effect on the voltage or signal with the reference potential corresponding to the potential of the first sub conductor Gs1. The noise input to the first sub conductor Gs1 is output to outside the relay apparatus 10 via the first main conductor Gm1 and the power supply connector 20. Note that the signal processing circuit 31 may have a configuration in which the two second suppressors 46a and 46b are not provided.

Relay 11 Configuration

Figure 4:
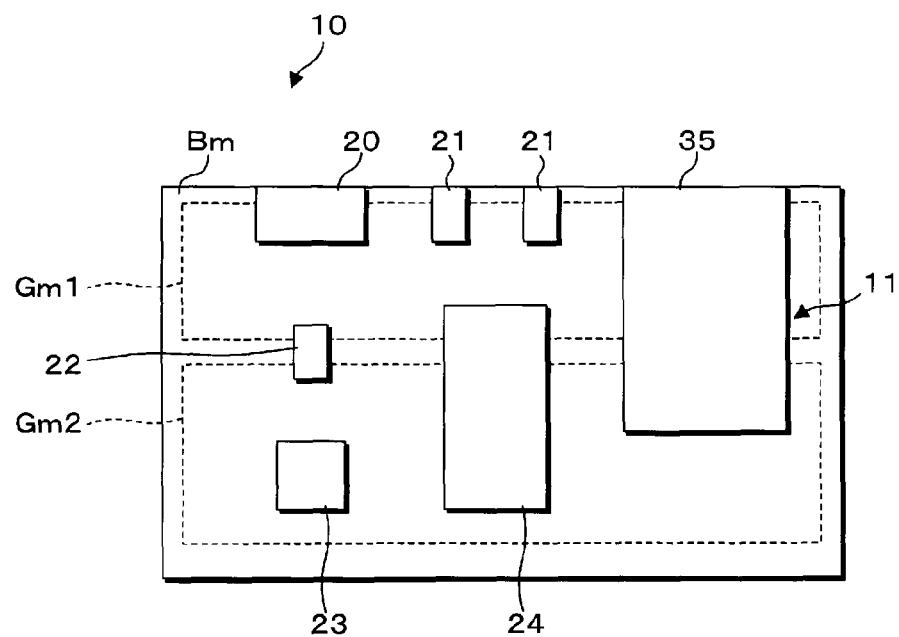
FIG. 4 is a plan view of a relay apparatus and the relay.

FIG. 4 is a plan view of the relay apparatus 10 and the relay 11. In the example illustrated in FIG. 4, the number of bus connectors 21 is two. As described above, the number of bus connectors 21 may be one or 3 or more. As illustrated in FIG. 4, the relay apparatus 10 further includes a main substrate Bm. The first main conductor Gm1 and the second main conductor Gm2 are disposed inside the main substrate Bm. The first main conductor Gm1 and the second main conductor Gm2 each have a plate-like shape. The first main conductor Gm1 and the second main conductor Gm2 are arranged in the front-and-back direction of relay apparatus 10. The main surface of the first main conductor Gm1 and the main surface of the second main conductor Gm2 face the main surface of the main substrate Bm. The main surface of the plate is a surface that has a wide width and is not an end surface.

The relay 11, the power supply connector 20, the two bus connectors 21, the common mode choke coil 22, the power supply circuit 23, and the communication circuit 24 are disposed on the main surface of the main substrate Bm. As described above, the power supply connector 20 is connected to the first main conductor Gm1. The power supply circuit 23 is connected to the second main conductor Gm2. The relay 11, the common mode choke coil 22, and the communication circuit 24 are each connected to both the first main conductor Gm1 and the second main conductor Gm2. The connection to the first main conductor Gm1 or the second main conductor Gm2 is implemented by providing a through hole in the main substrate Bm, for example.

Relay 11 External Appearance

Figure 5:
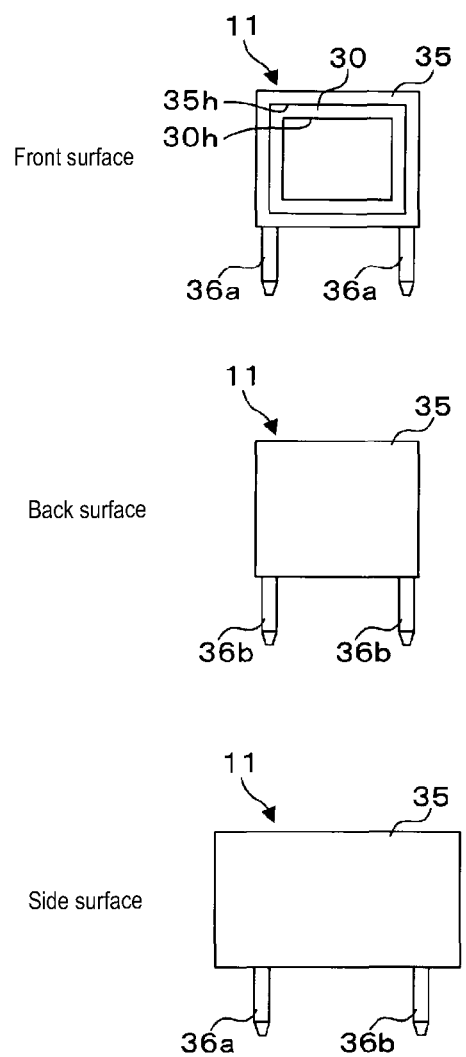
FIG. 5 is an explanatory diagram of the external appearance of the relay.

FIG. 5 is an explanatory diagram of the external appearance of the relay 11.

In FIG. 5, the front surface, the back surface, and the side surface of the relay 11 are illustrated. The relay 11 includes a box 35 with one face open. The box 35 is a hollow rectangular parallelepiped. An opening 35h is provided in the front surface of the box 35.

Two first projection portions 36a and two second projection portions 36b project downward (outside the box 35) from the lower surface of the box 35. The two first projection portions 36a are arranged side by side in the left-and-right direction. The two second projection portions 36b are also arranged side by side in the left-and-right direction. The first projection portions 36a and the second projection portions 36b are disposed on the front side and the back side. The upper side in FIG. 4 corresponds to the front side of the relay 11. The communication line connector 30 is inserted into the box 35 from the opening 35h.

Figure 6:
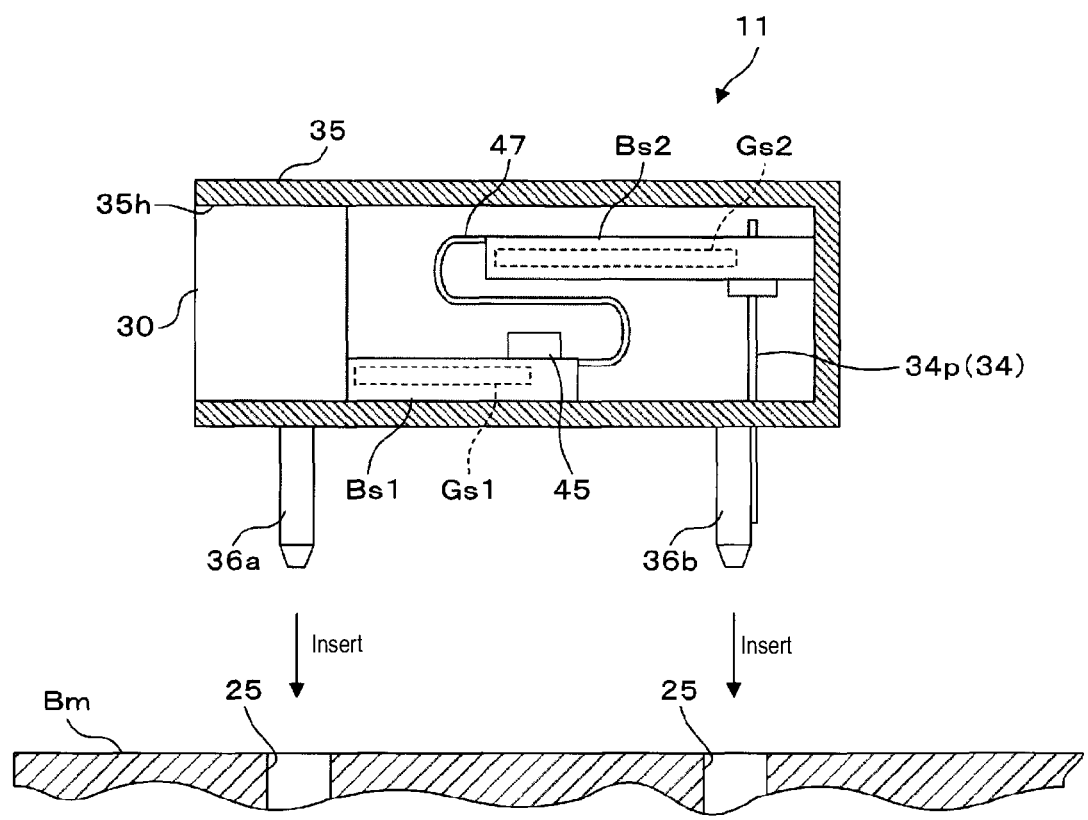
FIG. 6 is a cross-sectional view of the relay.

FIG. 6 is a cross-sectional view of the relay 11. As illustrated in FIGS. 5 and 6, the communication line connector 30 is a hollow rectangular parallelepiped with one face open. As illustrated in FIG. 5, an opening 30h is provided in the front surface of the communication line connector 30. For example, a cable including the plurality of communication lines Lc is inserted into the opening 30h of the communication line connector 30. In this manner, the plurality of communication lines Lc are connected to the communication line connector 30. As illustrated in FIG. 6, the back surface of the communication line connector 30 blocks the opening 35h of the box 35. A plurality of through holes 25 extending through in the up-and-down direction are provided in the main substrate Bm. The first projection portions 36a and the second projection portions 36b of the relay 11 are inserted into the through holes 25 of the main substrate Bm.

Thereafter, the first projection portions 36a and the second projection portions 36b are connected to the main substrate Bm via soldering. In this manner, the box 35 is fixed to the main substrate Bm. The box 35 and the first projection portions 36a have electrical conductivity. The first projection portions 36a, for example, are conductively connected to the first main conductor Gm1 disposed inside the main substrate Bm via soldering.

Inside the Relay 11

Figure 7:
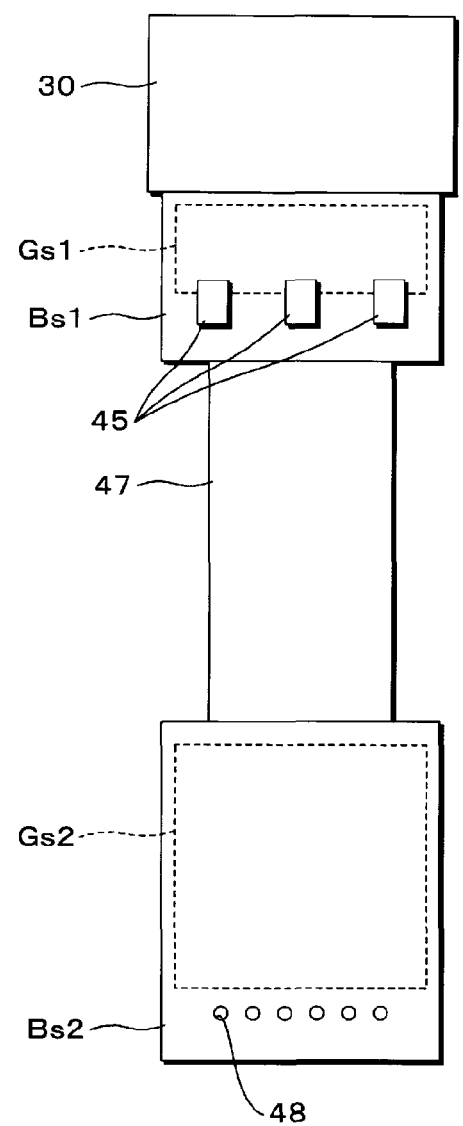
FIG. 7 is an explanatory diagram of a plurality of members housed in a box of the relay.

FIG. 7 is an explanatory diagram of a plurality of members housed in the box 35 of the relay 11. In the state illustrated in FIG. 7, the plurality of members are removed from the box 35 and placed on a flat surface. As illustrated in FIGS. 6 and 7, a first sub substrate Bs1 and a second sub substrate Bs2, which have a rectangular shape, are housed in the box 35 of the relay 11. As illustrated in FIG. 6, the first sub substrate Bs1 and the second sub substrate Bs2 are disposed with a gap inbetween. The main surface of the first sub substrate Bs1 faces the main surface of the second sub substrate Bs2.

As illustrated in FIGS. 6 and 7, the end surface of the front side of the first sub substrate Bs1 is connected to the back surface of the communication line connector 30. In the relay 11, the end surface of the back side of the first sub substrate Bs1 and the end surface of the front side of the second sub substrate Bs2 are connected by a substrate connector 47 which is rectangular and has flexibility. The substrate connector 47 is bent a plurality of times. The substrate connector 47 is a FPC (Flexible Printed Circuit), for example. On the first sub substrate Bs1 and the second sub substrate Bs2, a plurality of conductive patterns are disposed on the main surface of the insulating plate. The substrate connector 47 conductively connects the conductive pattern of the first sub substrate Bs1 to the conductive pattern of the second sub substrate Bs2.

A plurality of circuit elements forming the two first suppressors 40a and 40b, the three resistors 41a, 41b, and 42, the three capacitors 43, 44a, and 44b, and the common mode choke coil 45 are disposed on the main surface of the first sub substrate Bs1. The circuit elements function as a first circuit element. In FIGS. 6 and 7, only the common mode choke coil 45 is illustrated. On the main surface of the second sub substrate Bs2, the plurality of circuit elements forming the two second suppressors 46a and 46b, the conversion unit 32, and the relay unit 33 are disposed. The circuit elements function as a second circuit element. In FIGS. 6 and 7, the second circuit element is omitted.

The first sub conductor Gs1 is disposed inside the first sub substrate Bs1. The second sub conductor Gs2 is disposed inside the second sub substrate Bs2. The first sub conductor Gs1 and the second sub conductor Gs2 function as the first conductor and the second conductor. The first sub substrate Bs1 and the second sub substrate Bs2 function as a first substrate and a second substrate.

The box 35 is conductively connected to the first sub conductor Gs1 via a non-illustrated conductor. As described above, the first projection portions 36a project from the box 35. Accordingly, the first projection portions 36a are conductively connected to the box 35. As a result, the first projection portions 36a are conductively connected to the first sub conductor Gs1 via the box 35. As described above, when the box 35 of the relay 11 is fixed to the main substrate Bm via soldering, the first projection portions 36a are conductively connected to the first main conductor Gm1. Accordingly, the first sub conductor Gs1 is conductively connected to the first main conductor Gm1 via the box 35 and the first projection portions 36a. The first main conductor Gm1 and the first sub conductor Gs1 are treated as one conductor. Note that the box 35 is separated from the second sub conductor Gs2. The box 35 is not directly conductively connected to the second main conductor Gm2 via a conductor.

Figure 8:
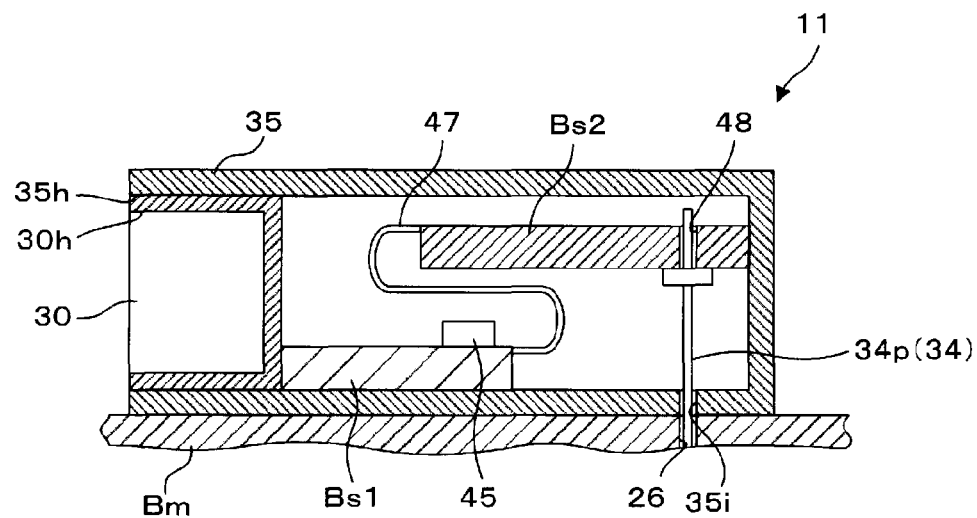
FIG. 8 is another cross-sectional view of the relay.

FIG. 8 is another cross-sectional view of the relay 11. The apparatus connector 34 of the relay 11 includes a conductive rod 34p with electrical conductivity. The conductive rod 34p functions as a second conductive rod. The conductive rod 34p is a so-called lead pin. As illustrated in FIGS. 7 and 8, on the back side of the second sub substrate Bs2, an insertion hole 48 where the conductive rod 34p is inserted is provided. The insertion hole 48 functions as a second insertion hole. The insertion hole 48 extends through in the up-and-down direction. As illustrated in FIG. 7, a plurality of the insertion holes 48 are arranged side by side in the left-and-right direction. In the example in FIG. 7, six insertion holes 48 are provided. In FIG. 7, to prevent complexity in the diagram, only one insertion hole 48 is given a reference sign.

A through hole 35$i$ extending through in the up-and-down direction is provided in the lower surface of the box 35. An insertion hole 26 where the conductive rod 34$p$ is inserted is provided in the main surface of the main substrate Bm of the relay apparatus 10. The conductive rod 34$p$ passes through the through hole 35$i$. In this state, the conductive rod 34$p$ is inserted in the two insertion holes 26 and 48. Inside the insertion hole 26, the conductive rod 34$p$ is connected to the main substrate Bm via soldering. Inside the insertion hole 48, the conductive rod 34$p$ is connected to the second sub substrate Bs2 via soldering. Thus, the conductive rod 34$p$ of the apparatus connector 34 connects the second sub substrate Bs2 and the main substrate Bm of the relay apparatus 10. The conductive rod 34$p$ is conductively connected to the main substrate Bm and the conductive pattern provided on second sub substrate Bs2 via soldering.

Inside the through hole 35$i$, an insulator is embedded between the conductive rod 34$p$ and the box 35. The box 35 is separated from the conductive rod 34$p$ and not conductively connected to the conductive rod 34$p$.

The apparatus connector 34 includes at least three of the conductive rods 34$p$. As illustrated in FIG. 2, the first conductive rod 34$p$ connects the communication circuit 24 of the relay apparatus 10 and the relay unit 33 of the relay 11. The second conductive rod 34$p$ connects the power supply circuit 23 of the relay apparatus 10 and the conversion unit 32 and relay unit 33 of the relay 11. Accordingly, power is supplied from the power supply circuit 23 to the conversion unit 32 and the relay unit 33 via the conductive rod 34$p$ of the apparatus connector 34. The third conductive rod 34$p$ connects the second main conductor Gm2 of the relay apparatus 10 and the second sub conductor Gs2 of the relay 11. Accordingly, the second main conductor Gm2 is conductively connected to the second sub conductor Gs2. Thus, the second main conductor Gm2 and the second sub conductor Gs2 are treated as one conductor.

Relay 11 Effect

In the relay 11, the first sub substrate Bs1 and the second sub substrate Bs2 are connected via the substrate connector 47 which is flexible. Thus, the flexibility relating to how to arrange the first sub substrate Bs1 and the second sub substrate Bs2 is high. Accordingly, the first sub substrate Bs1 and the second sub substrate Bs2 can be arranged so that the area of the installation surface of the relay 11 is reduced. Specifically, by making one surface of the first sub substrate Bs1 and one surface of the second sub substrate Bs2 face one another, the area of the installation surface of the relay 11 is reduced. Since the area of the installation surface of the relay 11 is reduced, the installation surface of the communication device including the relay apparatus 10 and the relay 11 is reduced.

Second Embodiment

In the first embodiment, the configuration of the apparatus connector 34 of the relay 11 is not limited to a configuration including the conductive rod 34$p$. Hereinafter, the differences between the second embodiment and the first embodiment will be described. Configurations that are not described below are the same as in the first embodiment. Thus, configurations shared with the first embodiment are given the same reference sign as in the first embodiment and description thereof will be omitted.

Inside the Relay 11

Figure 9:
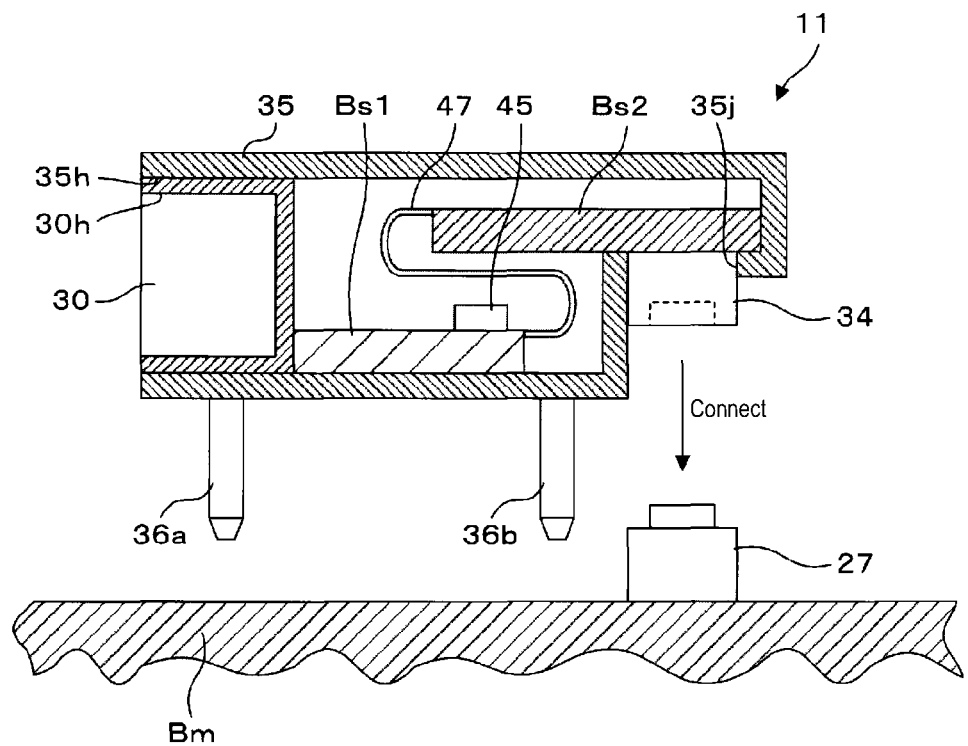
FIG. 9 is a cross-sectional view of a relay according to a second embodiment.

FIG. 9 is a cross-sectional view of the relay 11 according to the second embodiment. In the second embodiment, the apparatus connector 34 of the relay 11 is a rectangular parallelepiped. The upper surface of the apparatus connector 34 is installed on the lower surface of the second sub substrate Bs2. A through hole 35$j$ extending through in the up-and-down direction is provided in the lower surface of the box 35. The apparatus connector 34 is inserted into the through hole 35$j$ and exposed outside the box 35. A recess portion recessed upward is provided in the lower surface of the apparatus connector 34.

In the relay apparatus 10, a rectangular parallelepiped connector 27 connected to the apparatus connector 34 is installed on the upper main surface of the main substrate Bm. A projection portion projecting upward is provided on the upper surface of the connector 27. The projection portion of the connector 27 is inserted into the recess portion of the apparatus connector 34. In this manner, the apparatus connector 34 is connected to the connector 27.

The apparatus connector 34 is conductively connected to the conductive pattern provided on the second sub substrate Bs2. The connector 27 is conductively connected to the conductive pattern provided on the main substrate Bm. Thus, the apparatus connector 34 connects the second sub substrate Bs2 and the main substrate Bm of the relay apparatus 10 by connecting to the connector 27. The power supply circuit 23 of the relay apparatus 10 supplies power to the conversion unit 32 and the relay unit 33 via the apparatus connector 34. The relay 11 and the communication device according to the second embodiment achieve an effect similar to that of the first embodiment.

Third Embodiment

In the second embodiment, the shape of the apparatus connector 34 is not limited to a rectangular parallelepiped. Hereinafter, the differences between the third embodiment and the second embodiment will be described. Configurations that are not described below are the same as in the second embodiment. Thus, configurations shared with the second embodiment are given the same reference sign as in the second embodiment and description thereof will be omitted.

Inside the Relay 11

Figure 10:
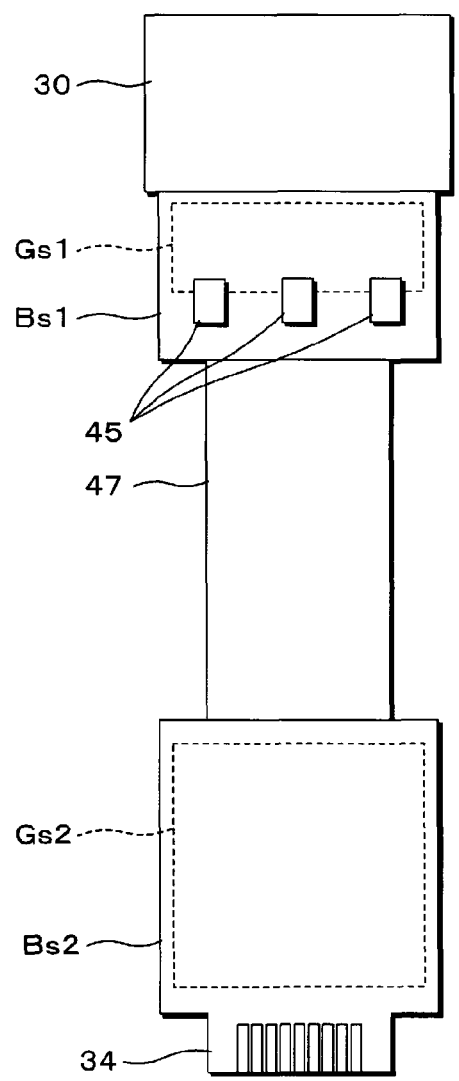
FIG. 10 is an explanatory diagram of a plurality of members housed in a box of a relay according to a third embodiment.
Figure 11:
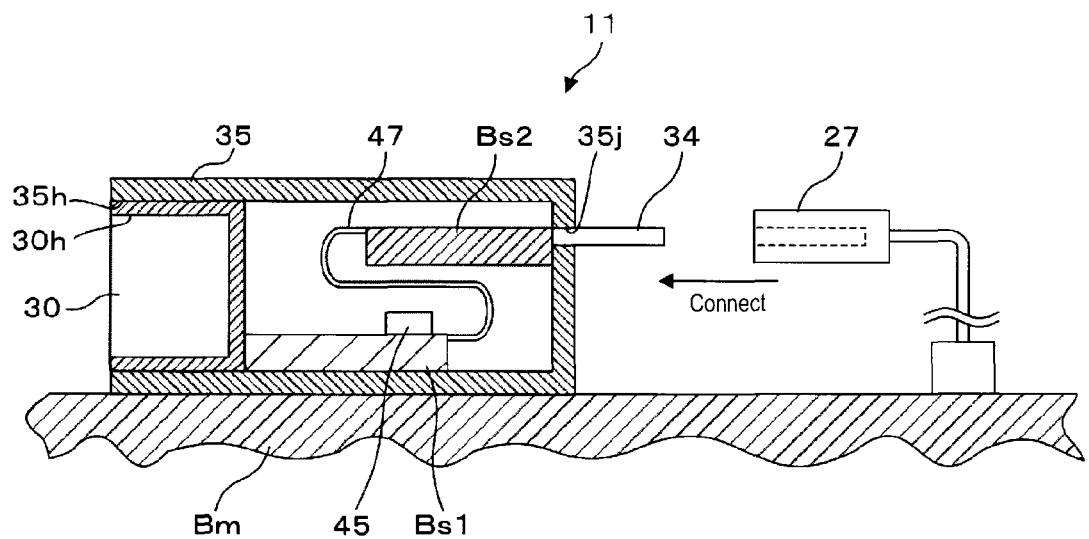
FIG. 11 is a cross-sectional view of the relay.

FIG. 10 is an explanatory diagram of a plurality of members housed in the box 35 of the relay 11 according to the third embodiment. FIG. 11 is a cross-sectional view of the relay 11. As illustrated in FIGS. 10 and 11, in the relay 11, the plate-like apparatus connector 34 projects backward from the end surface on the back side of the second sub substrate Bs2. The apparatus connector 34 is an edge connector. As illustrated in FIG. 10, a plurality of conductive patterns are disposed on the main surface of the apparatus connector 34.

In the third embodiment, the through hole 35$j$ is provided in the back surface of the box 35. The through hole 35$j$ extends through in the left-and-right direction. The apparatus connector 34 is inserted into the through hole 35$j$ and exposed on the back side of the box 35.

In the connector 27, the insertion portion where the apparatus connector 34 is inserted and the installation portion installed on the main surface of the main substrate Bm of the relay apparatus 10 are connected via a connection line. A recess portion recessed inward is provided in one surface of the insertion portion. The apparatus connector 34 is inserted into the recess portion of the insertion portion of the connector 27. In this manner, the apparatus connector 34 is connected to the connector 27.

The apparatus connector 34 is conductively connected to the conductive pattern provided on the second sub substrate Bs2. The connector 27 is conductively connected to the conductive pattern provided on the main substrate Bm. Thus, the apparatus connector 34 connects the second sub substrate Bs2 and the main substrate Bm of the relay apparatus 10 by connecting to the connector 27. The power supply circuit 23 of the relay apparatus 10 supplies power to the conversion unit 32 and the relay unit 33 via the apparatus connector 34. The relay 11 and the communication device according to the third embodiment achieve an effect similar to that of the second embodiment.

Fourth Embodiment

In the fourth embodiment, the apparatus connector 34 is not limited to an edge connector. Hereinafter, the differences between the fourth embodiment and the third embodiment will be described. Configurations that are not described below are the same as in the third embodiment. Thus, configurations shared with the third embodiment are given the same reference sign as in the third embodiment and description thereof will be omitted.

Inside the Relay 11

Figure 12:
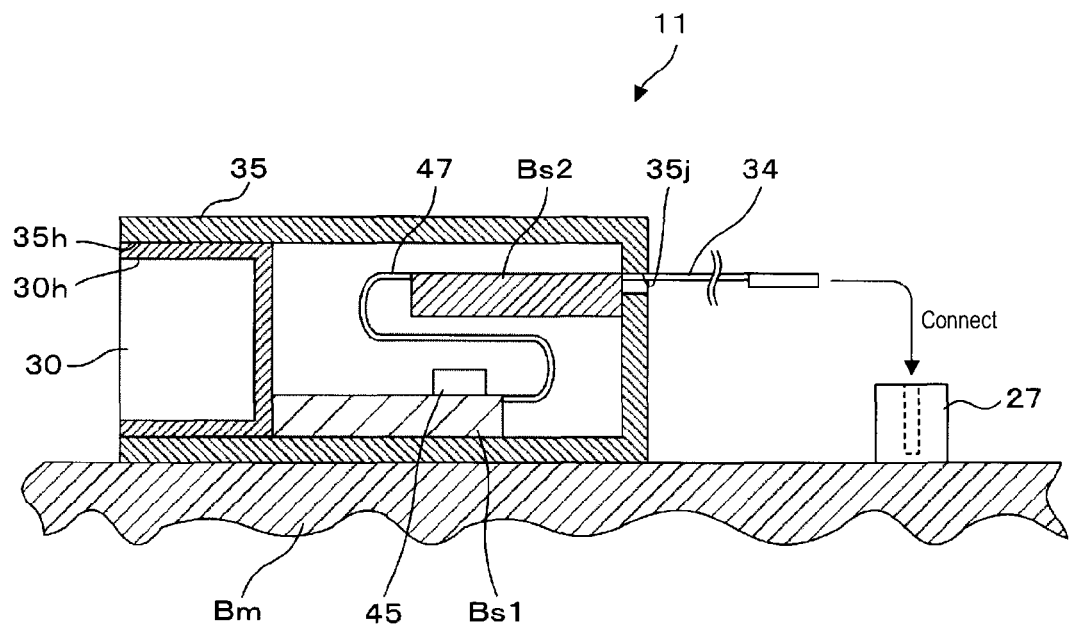
FIG. 12 is a cross-sectional view of a relay according to a fourth embodiment.

FIG. 12 is a cross-sectional view of the relay 11 according to the fourth embodiment. As illustrated in FIG. 12, in the relay 11, the plate-like apparatus connector 34 projects backward from the end surface on the back side of the second sub substrate Bs2. The apparatus connector 34 has flexibility. The apparatus connector 34 is an FPC, for example. One end portion of the apparatus connector 34 is installed on the second sub substrate Bs2. In the fifth embodiment, the apparatus connector 34 is inserted into the through hole 35*j* and exposed on the back side of the box 35. The other end portion of the apparatus connector 34 is connected to a plate-like terminal.

In the relay apparatus 10, the rectangular parallelepiped connector 27 connected to the apparatus connector 34 is installed on the upper main surface of the main substrate Bm. A recess portion recessed downward is provided in the upper surface of the connector 27. The terminal of the apparatus connector 34 is inserted into the recess portion of the connector 27. In this manner, the apparatus connector 34 is connected to the connector 27. Since the apparatus connector 34 has flexibility, the connection between the connector 27 and the apparatus connector 34 can be easily implemented.

The apparatus connector 34 is conductively connected to the conductive pattern provided on the second sub substrate Bs2. The connector 27 is conductively connected to the conductive pattern provided on the main substrate Bm. Thus, the apparatus connector 34 connects the second sub substrate Bs2 and the main substrate Bm of the relay apparatus 10 by connecting to the connector 27. The power supply circuit 23 of the relay apparatus 10 supplies power to the conversion unit 32 and the relay unit 33 via the apparatus connector 34. The relay 11 and the communication device according to the fourth embodiment achieve an effect similar to that of the third embodiment.

Fifth Embodiment

In the second embodiment, the arrangement of the first sub substrate Bs1 and the second sub substrate Bs2 is not limited to the arrangement in which the main surface of the first sub substrate Bs1 and the main surface of the second sub substrate Bs2 face one another. Hereinafter, the differences between the fifth embodiment and the second embodiment will be described. Configurations that are not described below are the same as in the second embodiment. Thus, configurations shared with the second embodiment are given the same reference sign as in the second embodiment and description thereof will be omitted.

Inside the Relay 11

Figure 13:
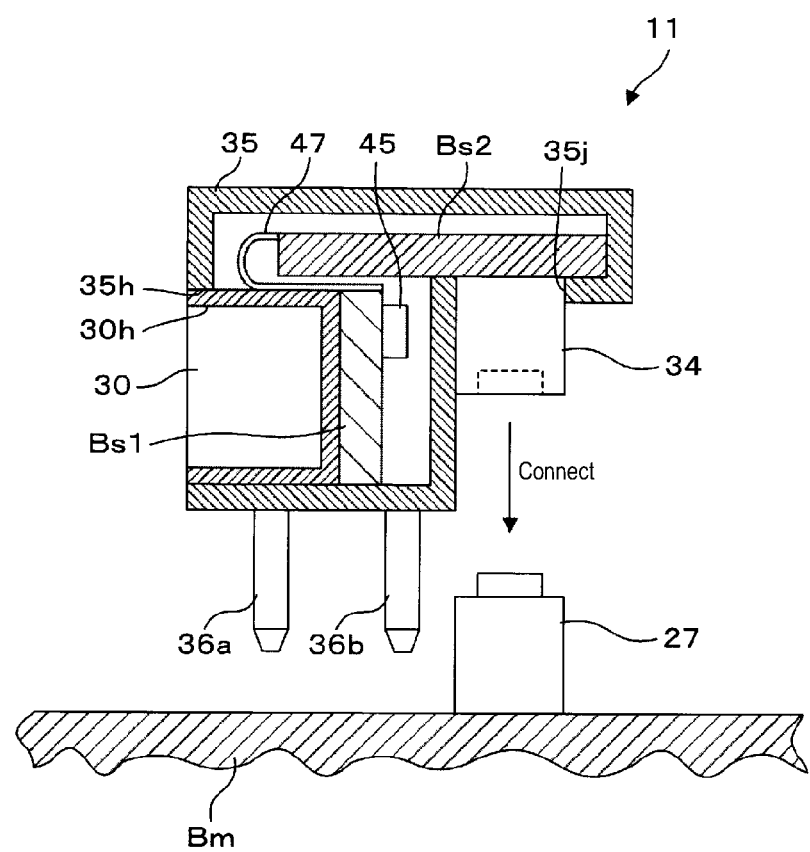
FIG. 13 is a cross-sectional view of a relay according to a fifth embodiment.

FIG. 13 is a cross-sectional view of the relay 11 according to the fifth embodiment. In the fifth embodiment, the opening 35*h* of the box 35 is blocked by the front surface of the communication line connector 30. As in the second embodiment, the opening 30*h* is provided in the front surface of the communication line connector 30. One main surface of the first sub substrate Bs1 is installed on the back surface of the communication line connector 30. A plurality of circuit elements (the first circuit element) are disposed on the other main surface of the first sub substrate Bs1.

As in the second embodiment, the second sub substrate Bs2 is disposed with the two main surfaces orientated upward and downward. A plurality of circuit elements (the second circuit element) are disposed on the upper main surface of the second sub substrate Bs2. Thus, the main surface of the first sub substrate Bs1 and the main surface of the second sub substrate Bs2 are perpendicular to one another.

Perpendicular herein means substantially perpendicular. Thus, the angle formed by the main surface of the first sub substrate Bs1 and the main surface of the second sub substrate Bs2 is not limited to 90 degrees. When an offset from 90 degrees is within design tolerance, the main surfaces of the first sub substrate Bs1 and the second sub substrate Bs2 are perpendicular.

In the fifth embodiment, the substrate connector 47 connects the upper end surface of the first sub substrate Bs1 and the end surface of the front side of the second sub substrate Bs2.

Relay 11 Effects

The relay 11 according to the fifth embodiment achieves similar effects to those achieved by the relay 11 according to the second embodiment except for those effects obtained by arranging one surface of the first sub substrate Bs1 facing one surface of the second sub substrate Bs2. In the relay 11 according to the fifth embodiment, by arranging the first sub substrate Bs1 and the second sub substrate Bs2 so that the main surface of the first sub substrate Bs1 and the main surface of the second sub substrate Bs2 are perpendicular to one another, the installation surface of the relay 11 is reduced.

Sixth Embodiment

In the fifth embodiment, the configuration of the apparatus connector 34 may be similar to the configuration of the fourth embodiment. Hereinafter, the differences between the sixth embodiment and the fifth embodiment will be described. Configurations that are not described below are the same as in the fifth embodiment. Thus, configurations shared with the fifth embodiment are given the same reference sign as in the fifth embodiment and description thereof will be omitted.

Figure 14:
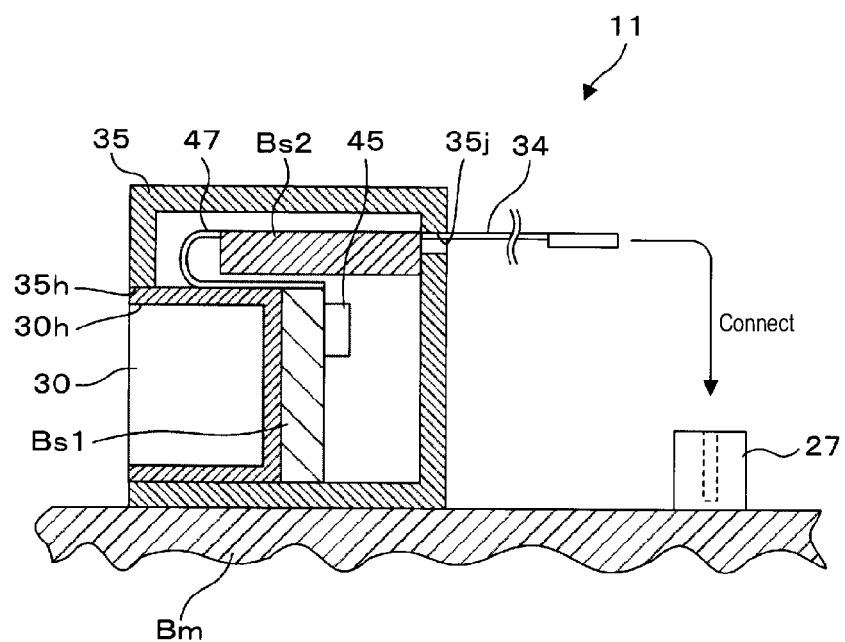
FIG. 14 is a cross-sectional view of a relay according to a sixth embodiment.

FIG. 14 is a cross-sectional view of the relay 11 according to the sixth embodiment. As in the fourth embodiment, the apparatus connector 34 has a plate-like shape and flexibility. The apparatus connector 34 projects backward from the end surface on the back side of the second sub substrate Bs2. The apparatus connector 34 is an FPC, for example. One end portion of the apparatus connector 34 is installed on the second sub substrate Bs2. In the fifth embodiment, the apparatus connector 34 is inserted into the through hole 35j and exposed on the back side of the box 35. The other end portion of the apparatus connector 34 is connected to a plate-like terminal.

The connector 27 of the relay apparatus 10 is configured as in the fourth embodiment. The plate portion of the apparatus connector 34 is inserted into the recess portion of the connector 27. In this manner, the apparatus connector 34 is connected to the connector 27. Since the apparatus connector 34 has flexibility, the connection between the connector 27 and the apparatus connector 34 can be easily implemented.

The apparatus connector 34 is conductively connected to the conductive pattern provided on the second sub substrate Bs2. The connector 27 is conductively connected to the conductive pattern provided on the main substrate Bm. Thus, the apparatus connector 34 connects the second sub substrate Bs2 and the main substrate Bm of the relay apparatus 10 by connecting to the connector 27. The power supply circuit 23 of the relay apparatus 10 supplies power to the conversion unit 32 and the relay unit 33 via the apparatus connector 34. The relay 11 and the communication device according to the sixth embodiment achieve an effect similar to that of the fifth embodiment.

Note that in the sixth embodiment, the configuration of the apparatus connector 34 may be a configuration including the conductive rod 34p as in the first embodiment. Also, the apparatus connector 34 may be an edge connector as in the third embodiment. In this case, the connector 27 is configured as in the third embodiment.

Seventh Embodiment

In the first embodiment, the first main conductor Gm1 of the relay apparatus 10 and the first sub conductor Gs1 of the relay 11 are conductively connected by the box 35 and the first projection portions 36a. However, the conductive connection between the first main conductor Gm1 and the first sub conductor Gs1 may be implemented by another method. Hereinafter, the differences between the seventh embodiment and the first embodiment will be described. Configurations that are not described below are the same as in the first embodiment. Thus, configurations shared with the first embodiment are given the same reference sign as in the first embodiment and description thereof will be omitted.

Figure 15:
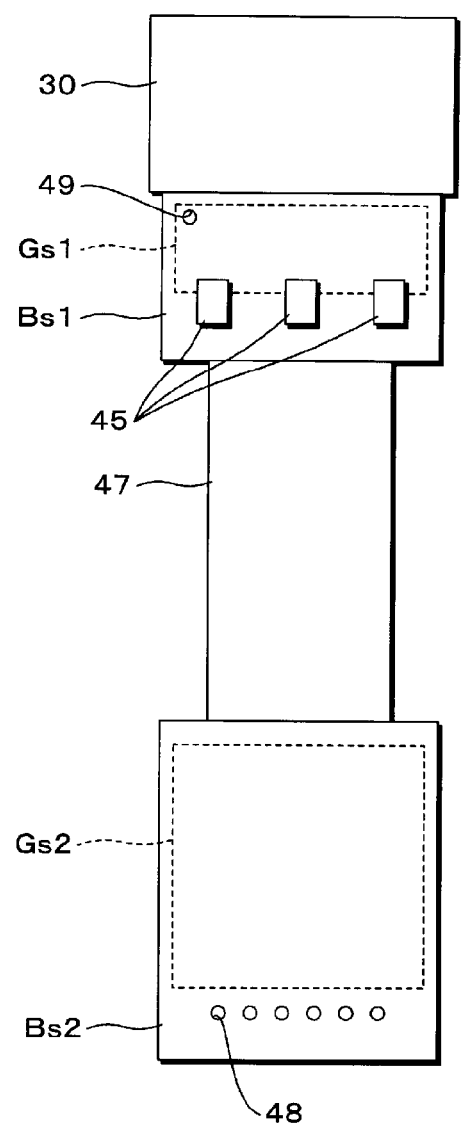
FIG. 15 is an explanatory diagram of a plurality of members housed in a box of a relay according to a seventh embodiment.
Figure 16:
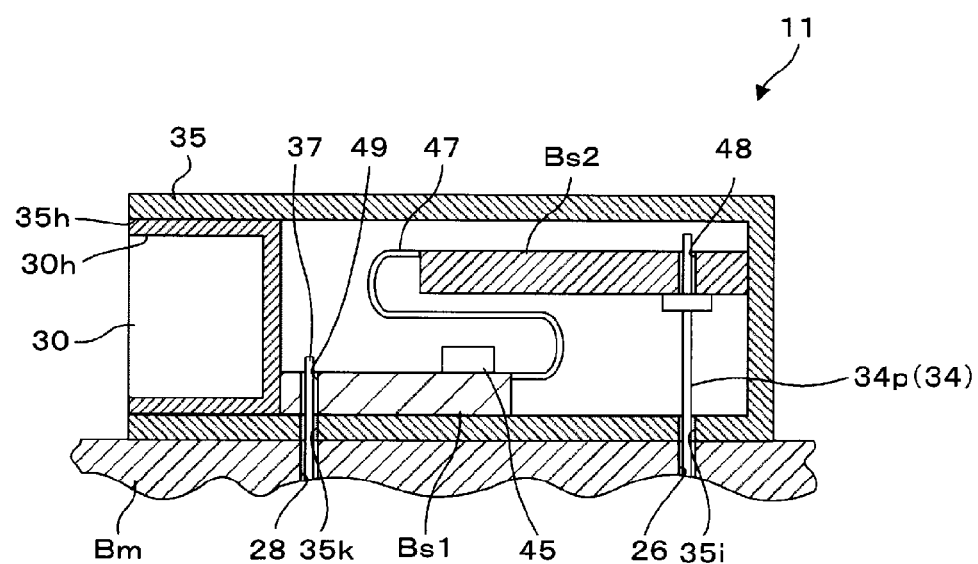
FIG. 16 is a cross-sectional view of the relay.

FIG. 15 is an explanatory diagram of a plurality of members housed in the box 35 of the relay 11 according to the seventh embodiment. FIG. 16 is a cross-sectional view of the relay 11. In FIG. 15, as in FIG. 7, only one insertion hole 48 is given a reference sign. As illustrated in FIGS. 15 and 16, on the front side of the first sub substrate Bs1, an insertion hole 49 extending through in the up-and-down direction is provided. As illustrated in FIG. 16, in the seventh embodiment, the relay 11 includes a conductive rod 37 with electrical conductivity. The conductive rod 37 is a so-called lead pin. The conductive rod 37 is inserted into the insertion hole 49.

A through hole 35k extending through in the up-and-down direction is provided in the lower surface of the box 35. An insertion hole 28 where the conductive rod 37 is inserted is provided in the main surface of the main substrate Bm of the relay apparatus 10. The conductive rod 37 passes through the through hole 35k. In this state, the conductive rod 37 is inserted in the two insertion holes 28 and 49. Inside the insertion hole 28, the conductive rod 37 is connected to the main substrate Bm via soldering. The conductive rod 37, for example, is conductively connected to the first main conductor Gm1 provided on the main substrate Bm via soldering.

Inside the insertion hole 49, the conductive rod 37 is connected to the first sub substrate Bs1 via soldering. The conductive rod 37, for example, is conductively connected to the first sub conductor Gs1 provided on the first sub substrate Bs1 via soldering. As described above, in the seventh embodiment, the first main conductor Gm1 and the first sub conductor Gs1 are conductively connected via the conductive rod 37. The relay 11 and the communication device according to the seventh embodiment achieve an effect similar to that of the first embodiment.

In the seventh embodiment, the first main conductor Gm1 and the first sub conductor Gs1 may not be conductively connected by the box 35 and the first projection portions 36a. The box 35 may be an insulator. Also, the box 35 may be made of resin, for example. As in the seventh embodiment, in the relay 11 according to the second to sixth embodiments, the conductive rod 37 may be used to implement the conductive connection between the first main conductor Gm1 and the first sub conductor Gs1. In the configuration of the fifth and sixth embodiments, the conductive rod 37 has an L shape.

Eighth Embodiment

In the fourth embodiment, the communication line connector 30 is not limited to a hollow rectangular parallelepiped with one face open. Hereinafter, the differences between the eighth embodiment and the fourth embodiment will be described. Configurations that are not described below are the same as in the fourth embodiment. Thus, configurations shared with the fourth embodiment are given the same reference sign as in the fourth embodiment and description thereof will be omitted.

Inside the Relay 11

Figure 17:
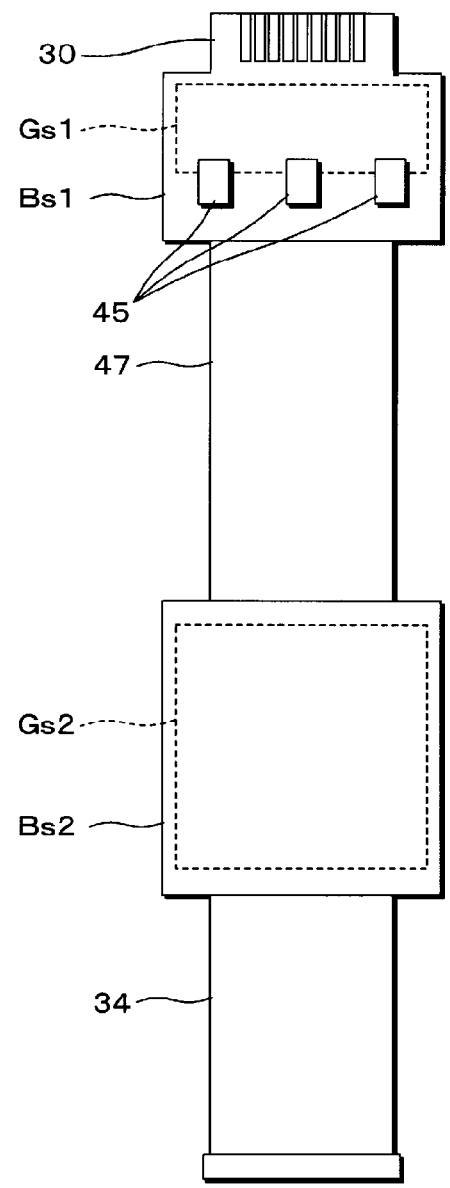
FIG. 17 is an explanatory diagram of a plurality of members housed in a box of a relay according to an eighth embodiment.
Figure 18:
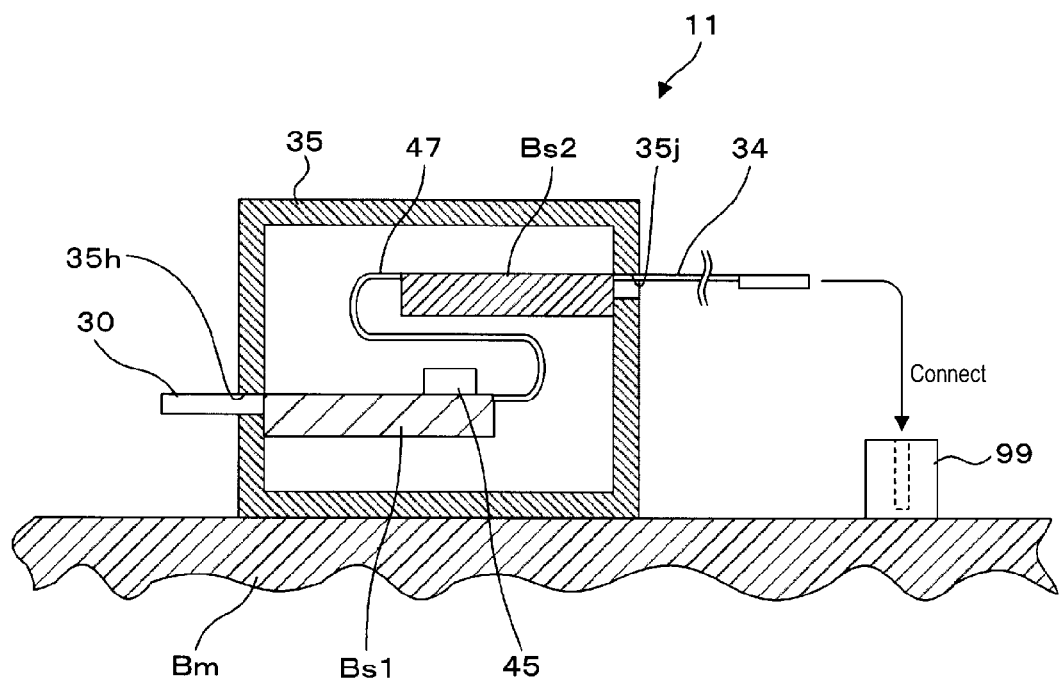
FIG. 18 is a cross-sectional view of the relay.

FIG. 17 is an explanatory diagram of a plurality of members housed in the box 35 of the relay 11 according to the eighth embodiment. FIG. 18 is a cross-sectional view of the relay 11. As illustrated in FIGS. 17 and 18, in the relay 11, the plate-like communication line connector 30 projects forward from the end surface on the front side of the first sub substrate Bs1. The communication line connector 30 is an edge connector. As illustrated in FIG. 17, a plurality of conductive patterns are disposed on the main surface of the communication line connector 30.

As illustrated in FIG. 18, the communication line connector 30 is inserted into the opening 35h of the box 35 and exposed on the front side of the box 35. For example, the plurality of communication lines Lc are housed inside a cable. The cable is provided with a recess portion. The communication line connector 30 is inserted into the recess portion of the cable. In this manner, the communication line connector 30 is connected to the plurality of communication lines Lc. The relay 11 and the communication device according to the eighth embodiment achieve an effect similar to that of the fourth embodiment.

In the relay 11 according to the first to third and the fifth to seventh embodiment, the communication line connector 30 may be an edge connector as in the fourth embodiment. When the main surface of the first sub substrate Bs1 and the main surface of the second sub substrate Bs2 are perpendicular to one another, the communication line connector 30 projects to the front side from the main surface on the front side of the first sub substrate Bs1.

Ninth Embodiment

In the first embodiment, the box 35 of the relay 11 is fixed to the main surface of the main substrate Bm of the relay apparatus 10 via soldering. However, the method of fixing the box 35 is not limited to a method using soldering. Hereinafter, the differences between the ninth embodiment and the first embodiment will be described. Configurations that are not described below are the same as in the first embodiment. Thus, configurations shared with the first embodiment are given the same reference sign as in the first embodiment and description thereof will be omitted.

Relay 11 External Appearance

Figure 19:
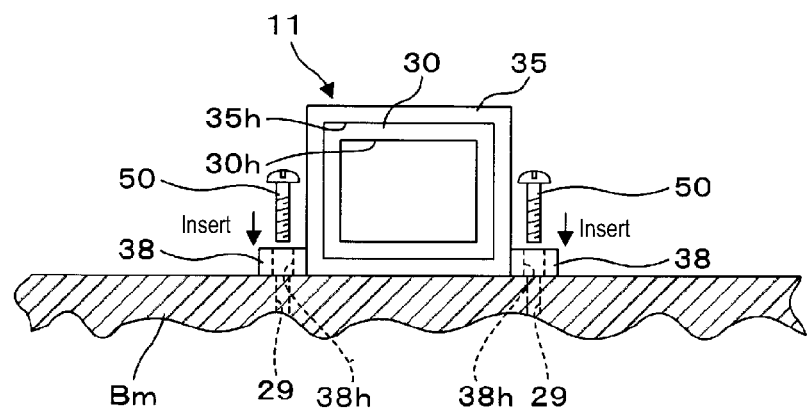
FIG. 19 is a front view of a relay according to a ninth embodiment.

FIG. 19 is a front view of the relay 11 according to the ninth embodiment. The relay 11 according to the ninth embodiment includes two first projection portions 38 instead of the two first projection portions 36a. As illustrated in FIG. 19, one of the first projection portions 38 projects to the left from the left surface of the box 35. The other first projection portion 38 projects to the right from the right surface of the box 35. A through hole 38h extending through in the up-and-down direction is provided in each of the first projection portions 38.

Two screw holes 29 are provided in the upper main surface of the main substrate Bm of the relay apparatus 10. Two screws 50 are passed through the two through holes 38h. In this state, the two screws 50 are inserted into the two screw holes 29. Then, the two screws 50 are tightened. By tightening the two screws 50, the box 35 is fixed to the main surface of the main substrate Bm. When the box 35 is fixed, the top portions of the screws 50 come into contact with the first projection portions 38.

The screws 50 and the first projection portions 38 have electrical conductivity. As described in the first embodiment, the box 35 has electrical conductivity and is conductively connected to the first sub conductor Gs1. Since the first projection portions 38 are provided on the box 35, the box 35 is conductively connected to the first projection portions 38. Thus, the first projection portions 38 are conductively connected to the first sub conductor Gs1 via the box 35. When the box 35 is fixed, the first projection portions 38 are in contact with the screws 50, and thus the screws 50 are conductively connected to the first projection portions 38. The screws 50 are conductively connected to the first main conductor Gm1 inside the main substrate Bm. As a result, the first sub conductor Gs1 is conductively connected to the first main conductor Gm1 via the box 35, the first projection portions 38, and the screws 50.

The relay 11 and the communication device according to the ninth embodiment achieve an effect similar to that of the first embodiment. Note that in the ninth embodiment, instead of the second projection portions 36b, second projection portions configured in a similar manner to the first projection portions 38 may be used. In this case also, screws are passed through the through holes of the second projection portions, and the screws are inserted into the screw holes in the main substrate Bm. Then, the screws are tightened.

Also, as in the ninth embodiment, the relay 11 according to the second to eighth embodiment may include the first projection portions 38 instead of the first projection portions 36a. In this case also, as in the ninth embodiment, the box 35 is fixed to the upper surface of the main substrate Bm using the screws 50.

Tenth Embodiment

In the first embodiment, the method of conductively connecting the second main conductor Gm2 and the second sub conductor Gs2 is not limited to a method using the conductive rod 34p. Hereinafter, the differences between the tenth embodiment and the first embodiment will be described. Configurations that are not described below are the same as in the first embodiment. Thus, configurations shared with the first embodiment are given the same reference sign as in the first embodiment and description thereof will be omitted.

Relay 11 External Appearance

Figure 20:
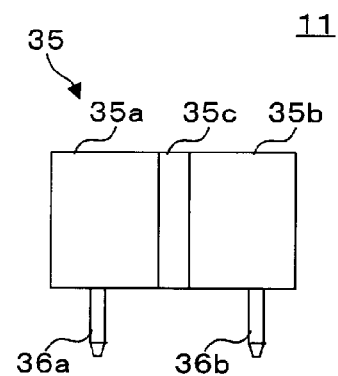
FIG. 20 is a side view of a relay according to a tenth embodiment.

FIG. 20 is a side view of the relay 11 according to the tenth embodiment. As illustrated in FIG. 20, the box 35 includes a first conductive portion 35a, a second conductive portion 35b, and a connection portion 35c. The first conductive portion 35a and the second conductive portion 35b are disposed on the front side and the back side. The connection portion 35c connects the first conductive portion 35a and the second conductive portion 35b. In the tenth embodiment, the shape of the box 35 is as in the first embodiment.

The first conductive portion 35a and the second conductive portion 35b have electrical conductivity. The connection portion 35c has insulating properties. The first conductive portion 35a is separated from the second conductive portion 35b by the connection portion 35c. The two first projection portions 36a project downward from the lower surface of the first conductive portion 35a. The two second projection portions 36b project downward from the lower surface of the second conductive portion 35b. The second projection portions 36b have electrical conductivity in a similar manner to the first projection portions 36a.

The first conductive portion 35a of the box 35 is conductively connected to the first sub conductor Gs1 via a non-illustrated conductor. The first projection portions 36a are conductively connected to the first conductive portion 35a. When the box 35 is fixed to the main substrate Bm of the relay apparatus 10 via soldering, the first projection portions 36a are conductively connected to the first main conductor Gm1. Accordingly, the first sub conductor Gs1 is conductively connected to the first main conductor Gm1 via the first conductive portion 35a and the first projection portions 36a.

In a similar manner, the second conductive portion 35b of the box 35 is conductively connected to the second sub conductor Gs2 via a non-illustrated conductor. The second projection portions 36b are conductively connected to the second conductive portion 35b. When the box 35 is fixed to the main substrate Bm of the relay apparatus 10 via soldering, the second projection portions 36b are conductively connected to the second main conductor Gm2. Accordingly, the second sub conductor Gs2 is conductively connected to the second main conductor Gm2 via the second conductive portion 35b and the second projection portions 36b.

As described above, the first projection portions 36a and the second projection portions 36b can be conductively connected to the first main conductor Gm1 and the second main conductor Gm2. Note that in the relay 11 according to the tenth embodiment, the conductive rod 34p connecting the second main conductor Gm2 and the second sub conductor Gs2 is not required.

The relay 11 and the communication device according to the tenth embodiment achieve an effect similar to that of the first embodiment. Note that in the second to ninth embodiment, the box 35 may be configured as in the tenth embodiment. In the second to eighth embodiment, the first projection portions 36a and the second projection portions 36b are provided as in the first embodiment. In the ninth embodiment, the first projection portions 38 project from the first conductive portion 35a. The second projection portions of the ninth embodiment have electrical conductivity and project from the second conductive portion 35b. In this case, screws with electrical conductivity are passed through the through holes of the second projection portions. The second sub conductor Gs2 is conductively connected to the second main conductor Gm2 via the second conductive portion 35b, the second projection portions and the screws.

Eleventh Embodiment

In the first embodiment, the second inductor 22b or a resistor connects the first main conductor Gm1 and the second main conductor Gm2. However, a member other than the second inductor 22b or a resistor may connect the first main conductor Gm1 and the second main conductor Gm2. Hereinafter, the differences between the eleventh embodiment and the first embodiment will be described. Configurations that are not described below are the same as in the first embodiment. Thus, configurations shared with the first embodiment are given the same reference sign as in the first embodiment and description thereof will be omitted.

Relay Apparatus 10 Configuration

Figure 21:
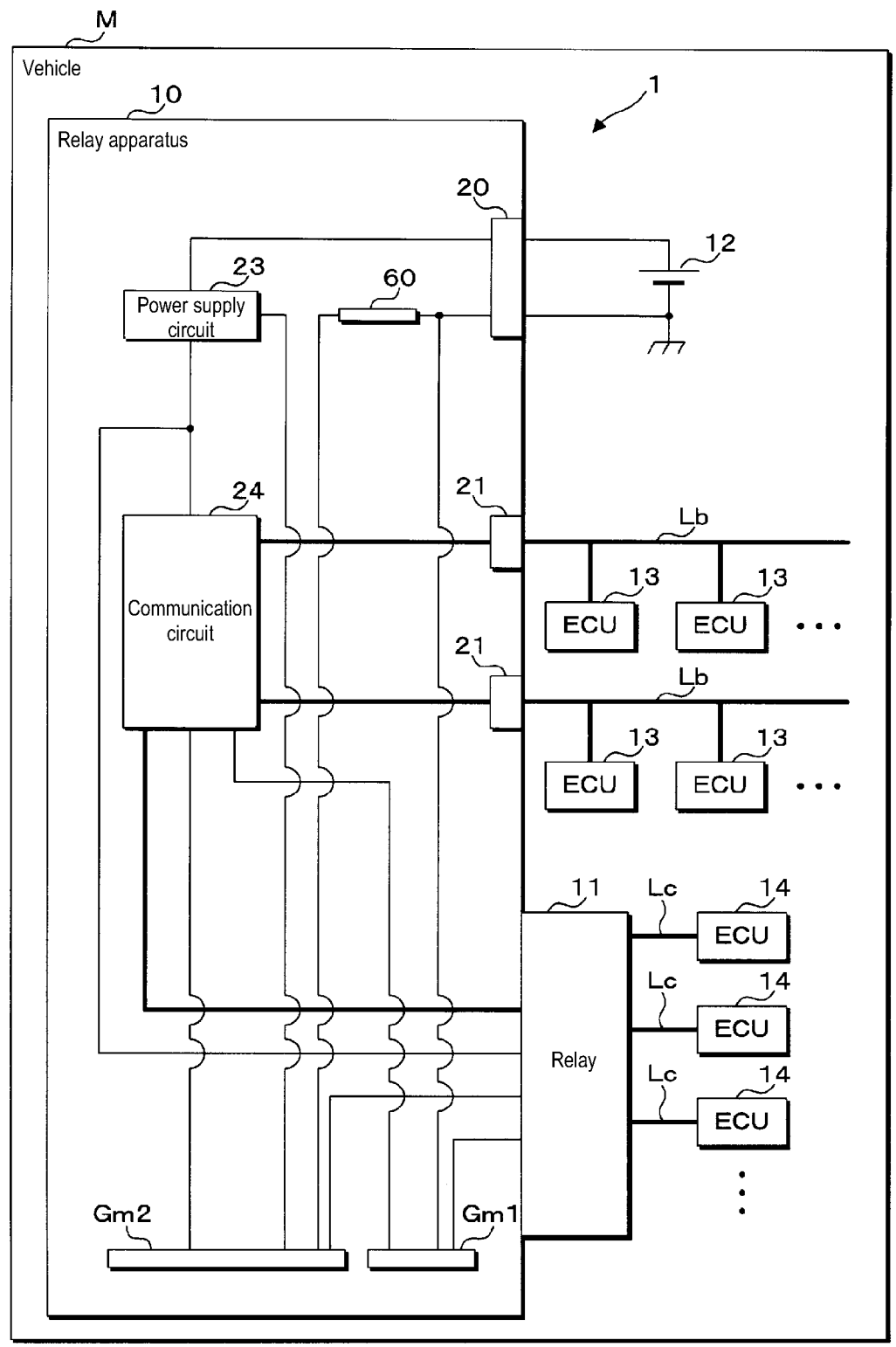
FIG. 21 is a block diagram illustrating the configuration of a main portion of a relay apparatus according to an eleventh embodiment.

FIG. 21 is a block diagram illustrating the configuration of a main portion of the relay apparatus 10. The relay apparatus 10 according to the eleventh embodiment has the same components of the relay apparatus 10 according to the first embodiment except the common mode choke coil 22 is not provided. The relay apparatus 10 according to the eleventh embodiment further includes a second conducting wire 60.

The power supply circuit 23 is directly connected to the power supply connector 20. One end of the second conducting wire 60 is connected to the power supply connector 20 and the first main conductor Gm1. The other end of the second conducting wire 60 is connected to the second main conductor Gm2. In this manner, the first main conductor Gm1 and the second main conductor Gm2 are connected via the second conducting wire 60.

The current flows from the positive electrode of the DC power supply 12 in order from the power supply circuit 23, the second main conductor Gm2, and the second conducting wire 60 and returns to the negative electrode of the DC power supply 12. The DC power supply 12 applies a voltage with the reference potential corresponding to the potential of the second main conductor Gm2 to the power supply circuit 23. The power supply circuit 23 decreases the voltage applied from the DC power supply 12 to a constant voltage such as 5V, 3.3 V, or the like. As in the first embodiment, the power supply circuit 23 applies the constant voltage generated by decreasing the voltage to the relay 11 and the communication circuit 24. Thus, the relay 11 and the communication circuit 24 are supplied with power. The reference potential of the constant voltage is the potential of the second main conductor Gm2. As in the first embodiment, the noise that enters the first sub conductor Gs1 of the relay 11 is output to outside the relay apparatus 10 via the first main conductor Gm1 and the power supply connector 20.

Figure 22:
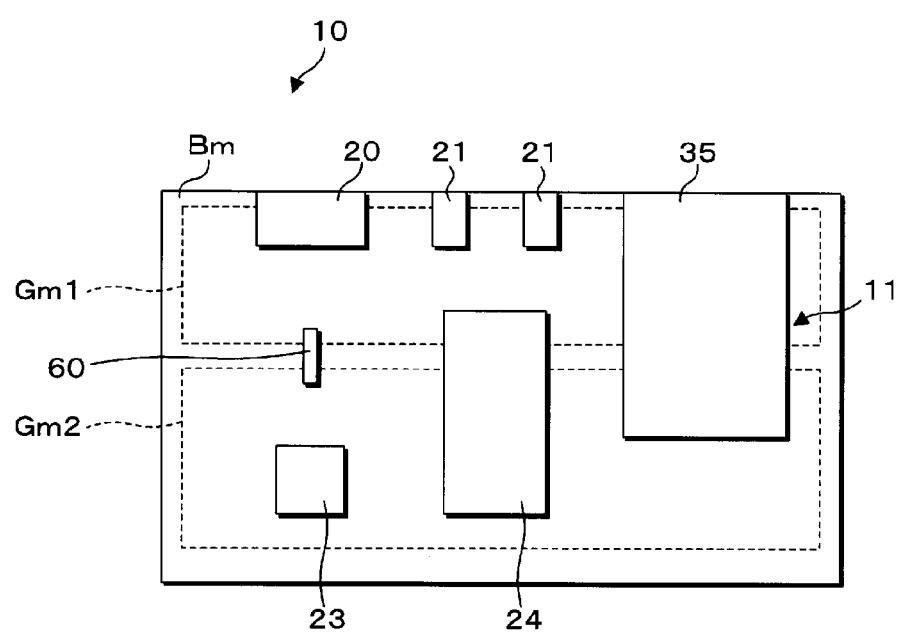
FIG. 22 is an explanatory diagram of the arrangement of a second conducting wire.

FIG. 22 is an explanatory diagram of the arrangement of the second conducting wire 60. As illustrated in FIG. 22, the second conducting wire 60 is disposed on the main surface of the main substrate Bm. One end of the second conducting wire 60 is located on the upper side of the first main conductor Gm1 and is connected to one point of the first main conductor Gm1. The other end of the second conducting wire 60 is located on the upper side of the second main conductor Gm2 and is connected to one point of the second main conductor Gm2.

The second conducting wire 60 includes a resistance component. Since the second conducting wire 60 has a linear shape, the cross-sectional area of the second conducting wire 60 is small. Thus, the resistance value of the resistance component of the second conducting wire 60 is large. This makes noise difficult to pass through the second conducting wire 60. When noise enters the first main conductor Gm1, even when the potential of the first main conductor Gm1 fluctuates, there is little effect on the voltage or electrical signal with the reference potential corresponding to the potential of the second main conductor Gm2. In a similar manner, when noise enters the second main conductor Gm2, even when the potential of the second main conductor Gm2 fluctuates, there is little effect on the voltage or signal with the reference potential corresponding to the potential of the first main conductor Gm1.

The communication device according to the eleventh embodiment achieves an effect similar to that of the first embodiment. As described in the first embodiment, the communication device includes the relay apparatus 10 and the relay 11. Note that the configuration of the relay 11 is not limited to the configuration in the first embodiment. The relay 11 of the eleventh embodiment may be configured in a similar manner to one of the relays 11 in the second to tenth embodiment.

Twelfth Embodiment

In the first embodiment, the negative electrode of the DC power supply 12 is connected to the first main conductor Gm1 via the power supply connector 20.

However, the negative electrode of the DC power supply 12 may not be connected to the first main conductor Gm1. Hereinafter, the differences between the twelfth embodiment and the first embodiment will be described. Configurations that are not described below are the same as in the first embodiment. Thus, configurations shared with the first embodiment are given the same reference sign as in the first embodiment and description thereof will be omitted.

Relay Apparatus 10 Configuration

Figure 23:
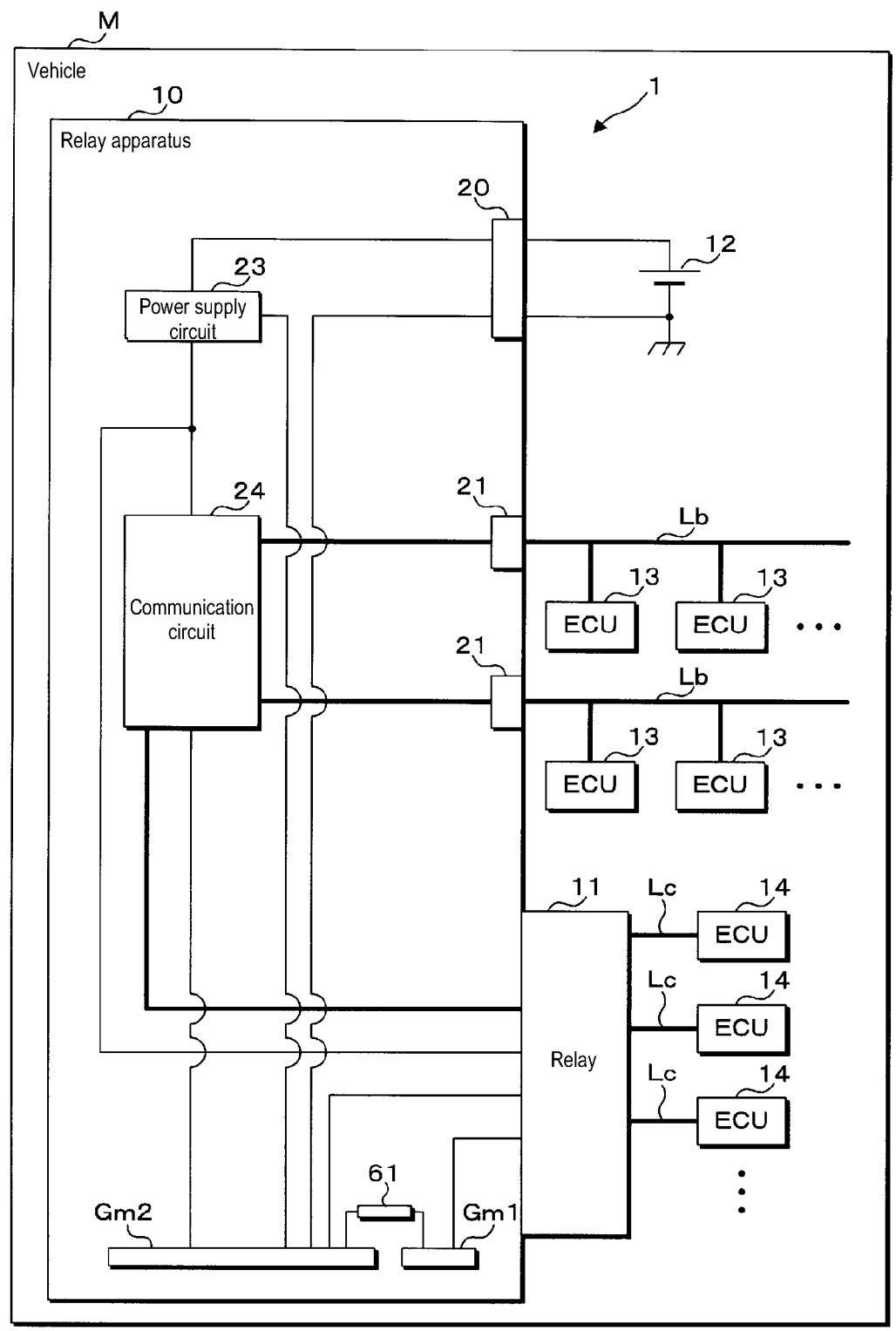
FIG. 23 is a block diagram illustrating the configuration of a main portion of a relay apparatus according to a twelfth embodiment.

FIG. 23 is a block diagram illustrating the configuration of a main portion of the relay apparatus 10 according to the twelfth embodiment. The relay apparatus 10 according to the twelfth embodiment has the same components of the relay apparatus 10 according to the first embodiment except the common mode choke coil 22 is not provided. The relay apparatus 10 according to the twelfth embodiment further includes a connecting component 61.

The power supply circuit 23 is directly connected to the power supply connector 20. The power supply connector 20 is further connected to the second main conductor Gm2. The power supply connector 20 is not connected to the first main conductor Gm1. The connecting component 61 is an inductor, a resistor, a conducting wire, or the like. The conducting wire includes a resistance component. One end of the connecting component 61 is connected to the first main conductor Gm1. The other end of the connecting component 61 is connected to the second main conductor Gm2. Thus, the first main conductor Gm1 and the second main conductor Gm2 are connected via the connecting component 61.

As described above, the connecting component 61 is an inductor, a resistor, a conducting wire, or the like. Thus, as in the first or eleventh embodiment, when noise enters the first main conductor Gm1, even when the potential of the first main conductor Gm1 fluctuates, there is little effect on the voltage or electrical signal with the reference potential corresponding to the potential of the second main conductor Gm2. In a similar manner, when noise enters the second main conductor Gm2, even when the potential of the second main conductor Gm2 fluctuates, there is little effect on the voltage or signal with the reference potential corresponding to the potential of the first main conductor Gm1.

Figure 24:
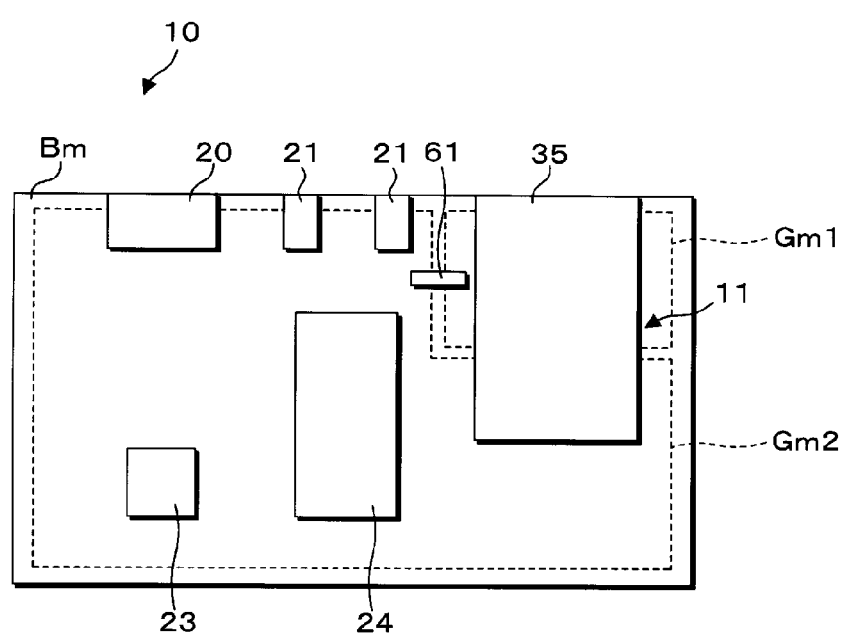
FIG. 24 is an explanatory diagram of the arrangement of a connecting component.

FIG. 24 is an explanatory diagram of the arrangement of the connecting component 61. As illustrated in FIG. 24, the connecting component 61 is disposed on the main surface of the main substrate Bm. One end of the connecting component 61 is located on the upper side of the first main conductor Gm1 and is connected to one point of the first main conductor Gm1. The other end of the connecting component 61 is located on the upper side of the second main conductor Gm2 and is connected to one point of the second main conductor Gm2.

As illustrated in FIG. 23, in the relay apparatus 10, the first main conductor Gm1 is not connected to the power supply connector 20. Thus, the first main conductor Gm1 does not need to be disposed near the power supply connector 20. Accordingly, as illustrated in FIG. 24, as the first main conductor Gm1, a plate-like conductor with a small area for the main surface can be used. When a plate-like conductor with a small area for the main surface is used as the first main conductor Gm1, as the second main conductor Gm2, a plate-like conductor with a large area for the main surface can be used. In this case, since the resistance value of the second main conductor Gm2 is low, the potential of the second main conductor Gm2 is stable.

The communication device according to the twelfth embodiment achieves an effect similar to that of the first embodiment. Note that the configuration of the relay 11 is not limited to the configuration in the first embodiment. The relay 11 of the twelfth embodiment may be configured in a similar manner to one of the relays 11 in the second to tenth embodiment.

Thirteenth Embodiment

Figure 25:
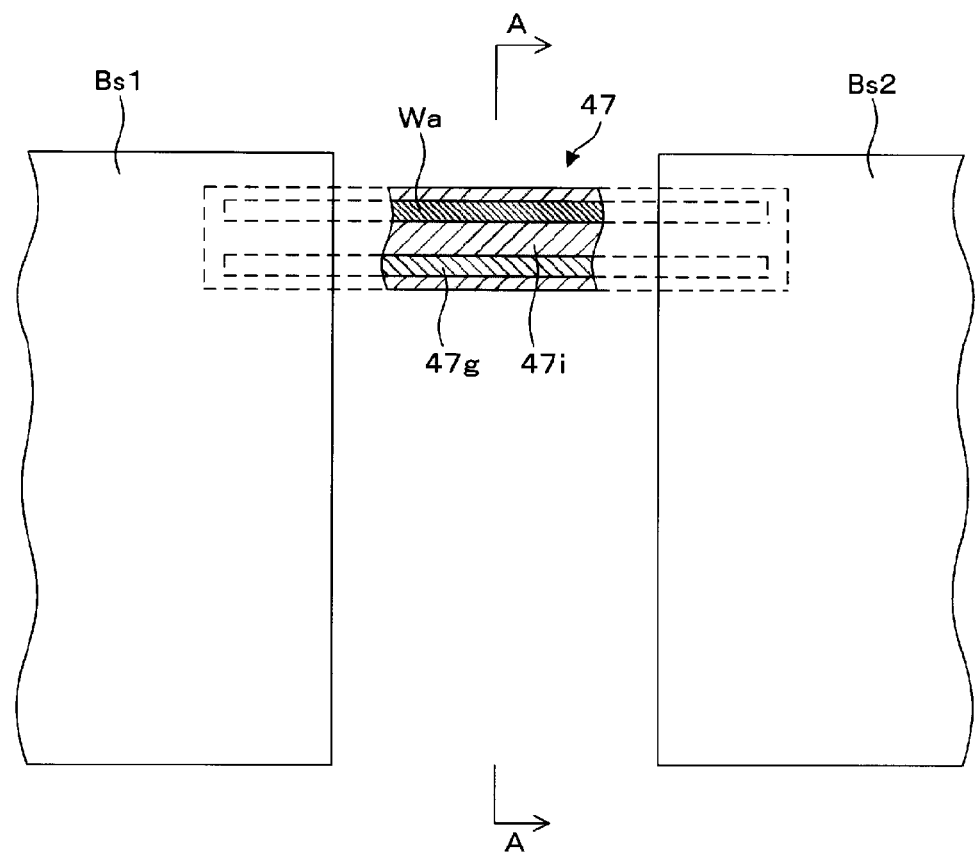
FIG. 25 is a partial cross-sectional view of a substrate connector according to a thirteenth embodiment.

In the first embodiment, the first sub conductor Gs1 of the relay 11 is connected to the first main conductor Gm1 of the relay apparatus 10. However, the first sub conductor Gs1 may not be connected to the first main conductor Gm1. Hereinafter, the differences between the thirteenth embodiment and the first embodiment will be described. Configurations that are not described below are the same as in the first embodiment. Thus, configurations shared with the first embodiment are given the same reference sign as in the first embodiment and description thereof will be omitted.
Relay 11 Configuration FIG. 25 is a partial cross-sectional view of the substrate connector 47 according to the thirteenth embodiment. In FIG. 25, the substrate connector 47, the first sub substrate Bs1, and the second sub substrate Bs2 are illustrated in a state of being disposed on a flat surface. In the box 35, the substrate connector 47 is bent a plurality of times. As described in the description of the first embodiment, the relay 11 includes the substrate connector 47 which has a rectangular shape and flexibility. The substrate connector 47 connects one end surface of the first sub conductor Gs1 and one end surface of the second sub conductor Gs2. One end portion of the substrate connector 47 is embedded in the first sub substrate Bs1. The other end portion of the substrate connector 47 is embedded in the second sub substrate Bs2.

Figure 26:
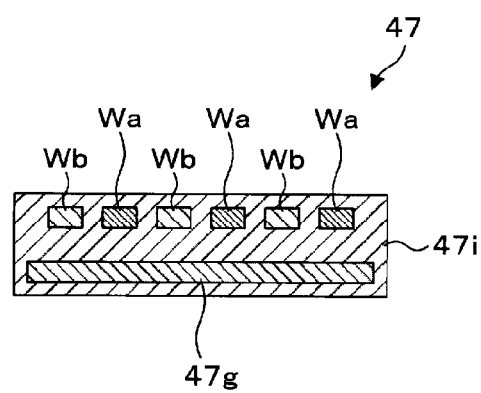
FIG. 26 is a cross-sectional view of the substrate connector taken along line A-A in FIG. 25.

FIG. 26 is a cross-sectional view of the substrate connector 47 taken along line A-A in FIG. 25. In the example illustrated in FIG. 26, the number of ECUs 14 is three. When the number of ECUs 14 is three, inside the relay 11, three communication lines Lc are disposed. Each communication line Lc includes the two conducting wires Wa and Wb along which differential signals propagate. The two conducting wires Wa and Wb included in each communication line Lc pass through the inside of the substrate connector 47.

In the substrate connector 47, the two conducting wires Wa and Wb included in each communication line Lc are embedded inside an insulator 47i. In the left-and-right direction, the conducting wires Wa and Wb are alternately arranged. The conducting wires Wa and Wb are disposed with a gap inbetween. Inside the insulator 47i, a connection conductor 47g with a rectangular plate-like shape is embedded. The connection conductor 47g is disposed on the lower side of the two conducting wires Wa and Wb included in each communication line Lc. The two conducting wires Wa and Wb included in each communication line Lc each face the common upper main surface of the connection conductor 47g with a gap therebetween. As described in the description of the first embodiment, regarding the plate, the main surface is a surface that has a wide width and is not an end surface.

Figure 27:
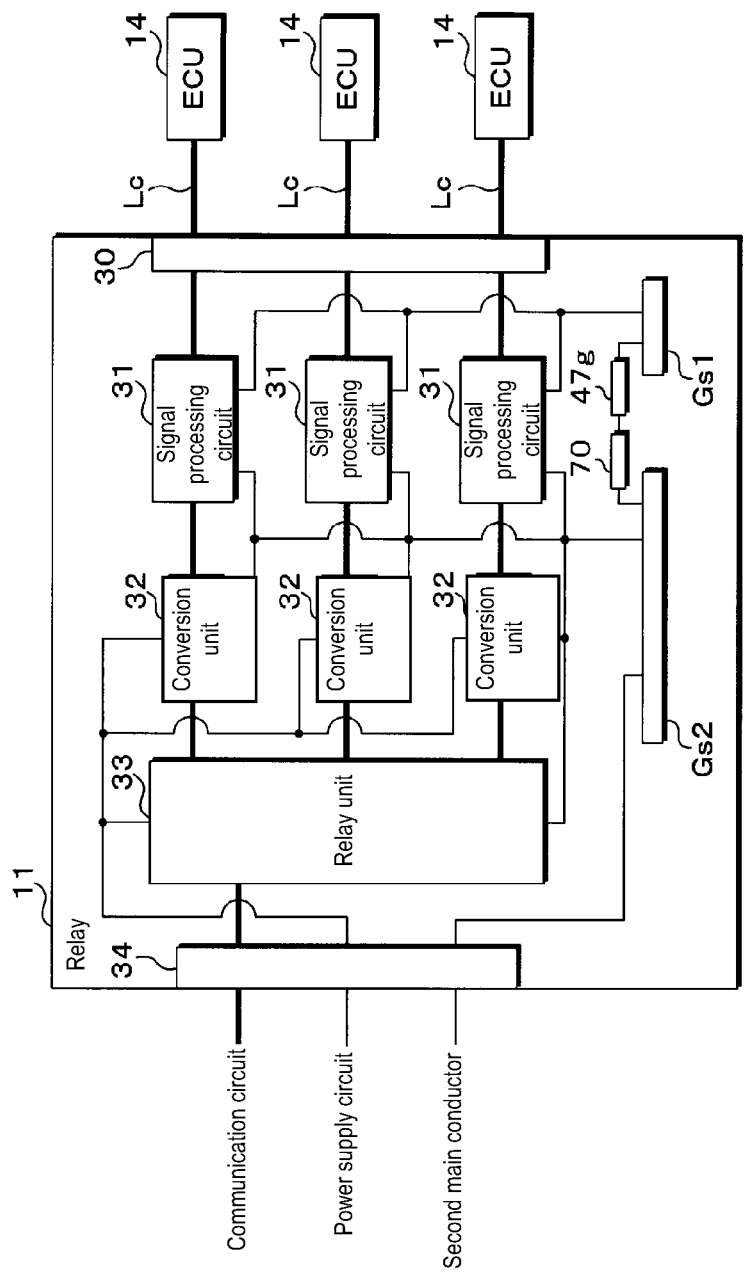
FIG. 27 is a block diagram illustrating the configuration of a main portion of a relay.
Figure 28:
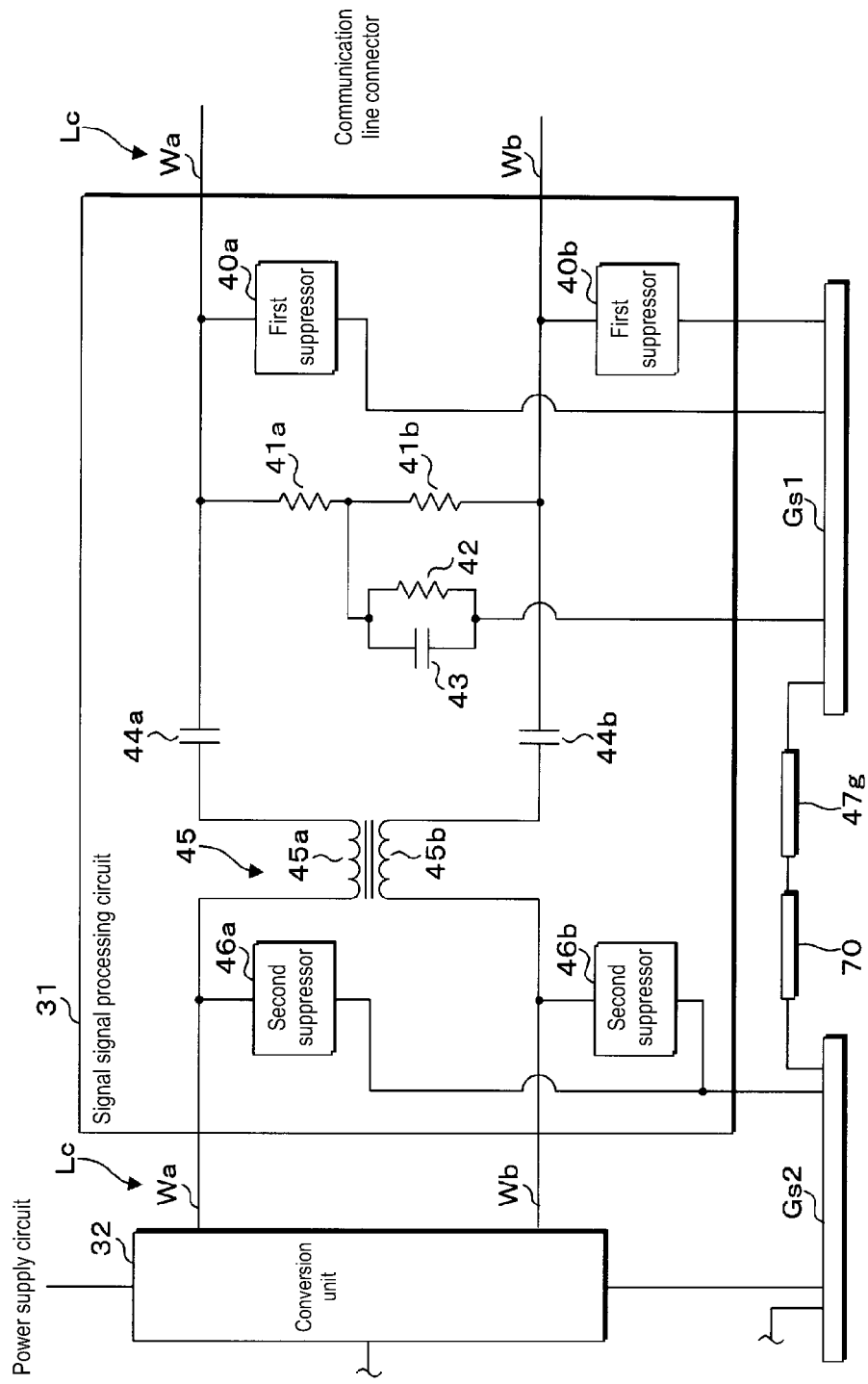
FIG. 28 is a circuit diagram of a signal processing circuit.

FIG. 27 is a block diagram illustrating the configuration of a main portion of the relay 11. FIG. 28 is a circuit diagram of the signal processing circuit 31. As illustrated in FIGS. 27 and 28, one end portion of the connection conductor 47g included in the substrate connector 47 is connected to the first sub conductor Gs1 and conductively connected to the first sub conductor Gs1. In the substrate connector 47, by disposing the connection conductor 47g, the characteristic impedance of the two conducting wires Wa and Wb included in each communication line Lc is adjusted to a constant value of 100Ω, 120Ω, or the like. As described in the description of the first embodiment, electrical signals propagate via the conducting wires Wa and Wb.

The relay 11 includes a conductor connecting element 70. The conductor connecting element 70 is an inductor, a resistor, a conducting wire, or the like. The conducting wire includes a resistance component. The conductor connecting element 70 connects the other end portion of the connection conductor 47g and the second sub conductor Gs2. As described above, one end portion of the connection conductor 47g is connected to the first sub conductor Gs1. Thus, the conductor connecting element 70 is connected between the first sub conductor Gs1 and the second sub conductor Gs2.

Figure 29:
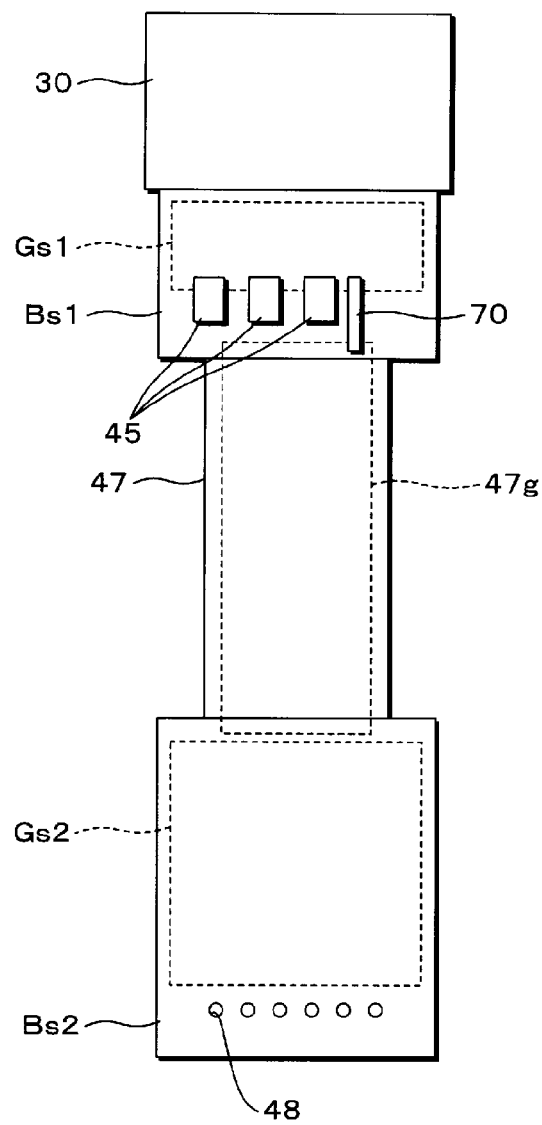
FIG. 29 is an explanatory diagram of the arrangement of a conductor connecting element.

FIG. 29 is an explanatory diagram of the arrangement of the conductor connecting element 70. As illustrated in FIG. 29, one end portion of the connection conductor 47g is located inside the first sub substrate Bs1. The other end portion of the connection conductor 47g is located inside the second sub substrate Bs2. The conductor connecting element 70 is disposed on the main surface of the first sub substrate Bs1. One end of the conductor connecting element 70 is located on the upper side of the first sub conductor Gs1. One end of the conductor connecting element 70 is connected to the first sub conductor Gs1 using a through hole, for example. The other end of the conductor connecting element 70 is located on the upper side of the connection conductor 47g. The other end of the conductor connecting element 70 is connected to the connection conductor 47g using a through hole, for example.

In the thirteenth embodiment, the first sub conductor Gs1 is not conductively connected to the first main conductor Gm1. In the first embodiment, the first sub conductor Gs1 is conductively connected to the first main conductor Gm1 via the box 35 and the first projection portion 37a. In the thirteenth embodiment, in a first example, one or both of the box 35 and the first projection portion 36a have insulating properties. In a second example, connection between the first projection portion 37a and the first main conductor Gm1 is not implemented.

The conductor connecting element 70 is connected between the first sub conductor Gs1 and the second sub conductor Gs2. Thus, when noise enters the first sub conductor Gs1, even when the potential of the first sub conductor Gs1 fluctuates, there is little effect on the voltage or signal with the reference potential corresponding to the potential of the second sub conductor Gs2. In a similar manner, when noise enters the second sub conductor Gs2, even when the potential of the second sub conductor Gs2 fluctuates, there is little effect on the voltage or signal with the reference potential corresponding to the potential of the first sub conductor Gs1.

The relay 11 and the communication device according to the thirteenth embodiment achieve an effect similar to that of the first embodiment. Note that in the thirteenth embodiment, the other end portion of the connection conductor 47g included in the substrate connector 47 may be connected to the second sub conductor Gs2 and may be conductively connected to the second sub conductor Gs2. In this case, one end portion of the connection conductor 47g is not conductively connected to the first sub conductor Gs1. When the other end portion of the connection conductor 47g is conductively connected to the second sub conductor Gs2, the conductor connecting element 70 connects one end portion of the connection conductor 47g and the first sub conductor Gs1. The conductor connecting element 70 is connected between the first sub conductor Gs1 and the second sub conductor Gs2.

Also, in the thirteenth embodiment, as in the first embodiment, the first sub conductor Gs1 may be conductively connected to the first main conductor Gm1. The apparatus connector 34 of the relay 11 may be configured as in one of the second or sixth embodiment. The shape of the apparatus connector 34 may be similar to the shape in one of the third or fourth embodiment. The first sub substrate Bs1 and the second sub substrate Bs2 may be disposed as in the fifth embodiment. When the first sub conductor Gs1 is conductively connected to the first main conductor Gm1, the conductive connection between the first main conductor Gm1 and the first sub conductor Gs1 may be implemented as in the seventh embodiment.

The shape of the communication line connector 30 may be similar to the shape in the eighth embodiment. As in the ninth embodiment, the box 35 of the relay 11 may be fixed to the main surface of the main substrate Bm of the relay apparatus 10. The conductive connection between the second main conductor Gm2 and the second sub conductor Gs2 may be implemented as in the tenth embodiment. As in the eleventh embodiment, the first main conductor Gm1 and the second main conductor Gm2 may be connected via a conducting wire. In this case, in the relay apparatus 10, the common mode choke coil 22 is not used. As in the twelfth embodiment, the first main conductor Gm1 and the second main conductor Gm2 may be connected via the connecting component 61.

Fourteenth Embodiment

In the thirteenth embodiment, the relay apparatus 10 may not include the first main conductor Gm1. Hereinafter, the differences between the fourteenth embodiment and the first embodiment will be described. Configurations that are not described below are the same as in the thirteenth embodiment. Thus, configurations shared with the thirteenth embodiment are given the same reference sign as in the thirteenth embodiment and description thereof will be omitted.

Relay Apparatus 10 Configuration

Figure 30:
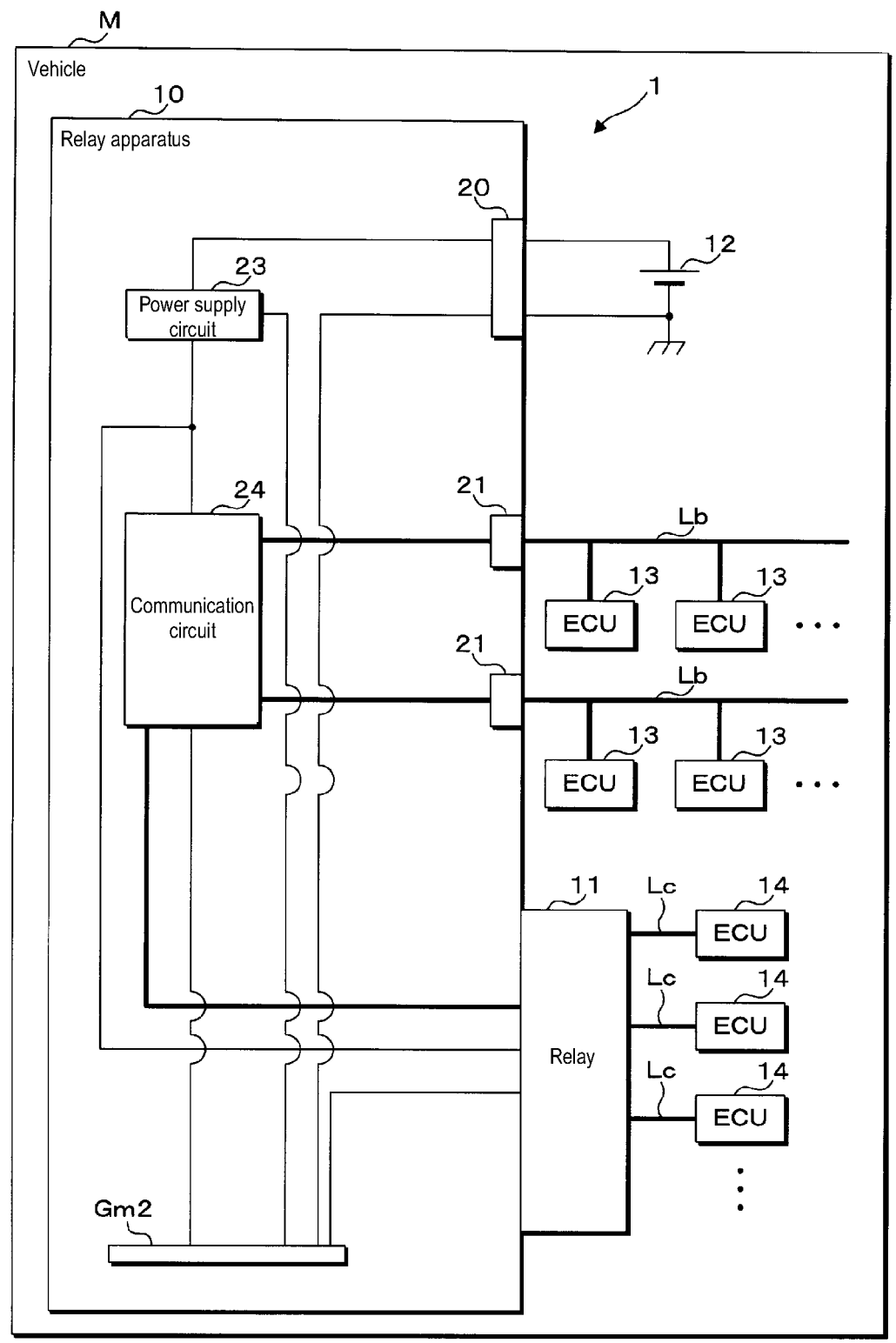
FIG. 30 is a block diagram illustrating the configuration of a main portion of a relay apparatus according to a fourteenth embodiment.

FIG. 30 is a block diagram illustrating the configuration of a main portion of the relay apparatus 10 according to the fourteenth embodiment. The relay apparatus 10 according to the fourteenth embodiment has the same components of the relay apparatus 10 according to the thirteenth embodiment except the common mode choke coil 22 and the first main conductor Gm1 is not provided.

The power supply circuit 23 is directly connected to the power supply connector 20. The power supply connector 20 is further connected to the second main conductor Gm2. Since the first main conductor Gm1 is not provided in the relay apparatus 10, the power supply connector 20 and the communication circuit 24 are not connected to the first main conductor Gm1.

In the fourteenth embodiment, the communication circuit 24 does not execute processing of the electrical signal using the potential of the first main conductor Gm1 as the reference potential. Thus, when the communication circuit 24 receives the differential signal via the communication bus Lb, the received differential signal is converted into a voltage signal with the reference potential corresponding to the potential of the second main conductor Gm2. The communication circuit 24 obtains the data included in the converted voltage signal.

Figure 31:
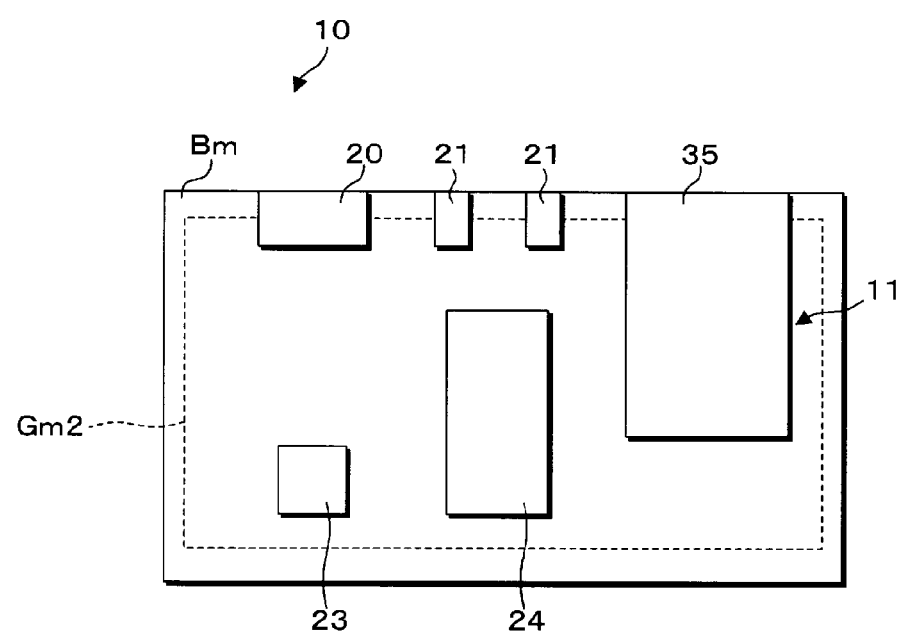
FIG. 31 is an explanatory diagram of the arrangement of a second main conductor.

FIG. 31 is an explanatory diagram of the arrangement of the second main conductor Gm2. Since the first main conductor Gm1 is not provided in the relay apparatus 10, as illustrated in FIG. 31, as the second main conductor Gm2, a plate-like conductor with a large area for the main surface can be used. In this case, since the resistance value of the second main conductor Gm2 is low, the potential of the second main conductor Gm2 is stable.

The relay 11 according to the fourteenth embodiment achieves similar effects to those achieved by the relay 11 according to the thirteenth embodiment except for the connection effects obtained by connecting the first main conductor Gm1 to the first sub conductor Gs1. The communication device according to the fourteenth embodiment achieves similar effects to those achieved by the communication device according to the thirteenth embodiment except for the connection effects and the effects achieved by the common mode choke coil 22.

Fifteenth Embodiment

In the first embodiment, the first main conductor Gm1 and the second main conductor Gm2 may be electrically connected. Hereinafter, the differences between the fifteenth embodiment and the first embodiment will be described. Configurations that are not described below are the same as in the first embodiment. Thus, configurations shared with the first embodiment are given the same reference sign as in the first embodiment and description thereof will be omitted.

Relay 11 Configuration

Figure 32:
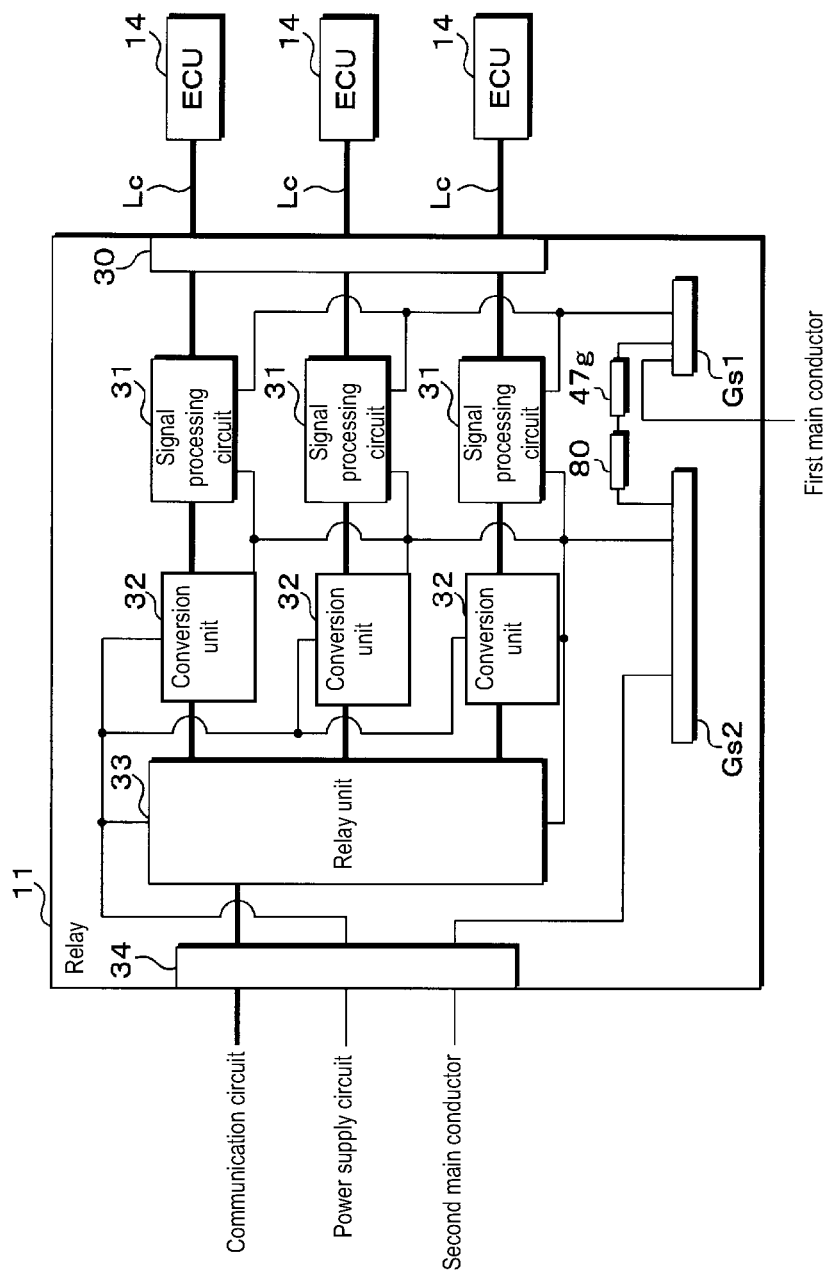
FIG. 32 is a block diagram illustrating the configuration of a main portion of a relay according to a fifteenth embodiment.
Figure 33:
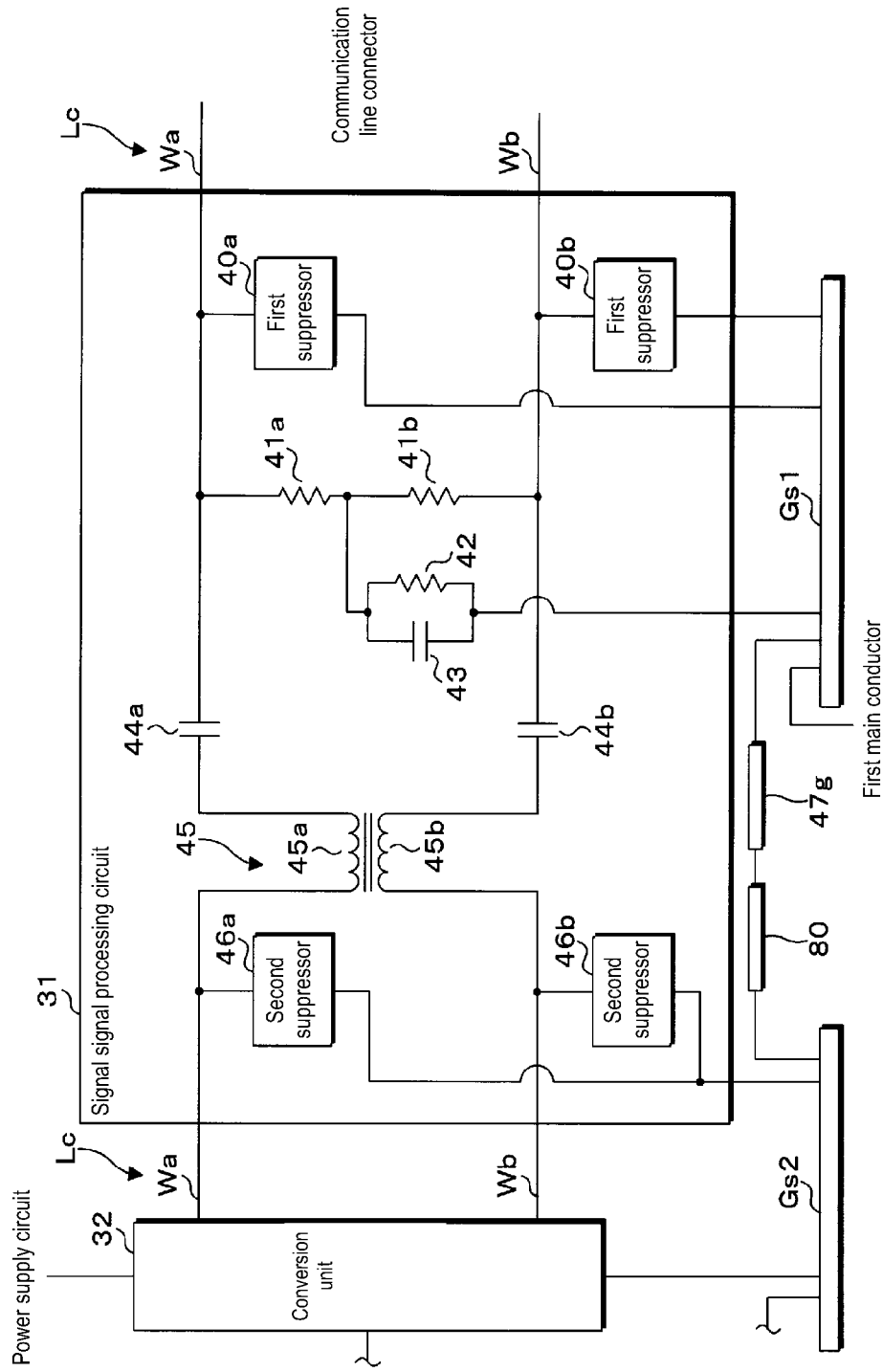
FIG. 33 is a circuit diagram of a signal processing circuit.

FIG. 32 is a block diagram illustrating the configuration of a main portion of the relay 11 according to the fifteenth embodiment. FIG. 33 is a circuit diagram of the signal processing circuit 31. The substrate connector 47 included in the relay 11 according to the fifteenth embodiment is configured as in the thirteenth embodiment (see FIGS. 25 and 26). Thus, the conducting wires Wa and Wb included in the communication line Lc pass through the substrate connector 47. One end portion of the connection conductor 47g included in the substrate connector 47 is connected to the first sub conductor Gs1 and conductively connected to the first sub conductor Gs1.

The relay 11 further includes an electrically connecting element 80 for implementing an electrical connection. The electrically connecting element 80 is an inductor, a resistor, a capacitor, a conducting wire, or the like. The conducting wire includes a resistance component. It is sufficient that the electrically connecting element 80 is a circuit element along which AC voltage propagates. One end of the electrically connecting element 80 is connected to the other end of the connection conductor 47g. The other end of the electrically connecting element 80 is connected to the second sub conductor Gs2. In this manner, the electrically connecting element 80 is connected between the connection conductor 47g and the second sub conductor Gs2.

Figure 34:
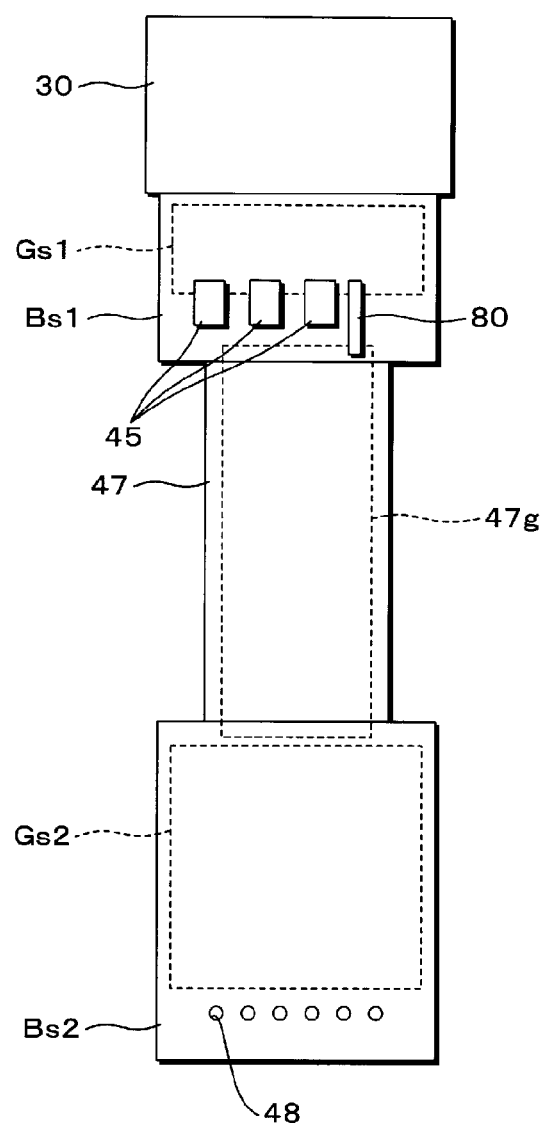
FIG. 34 is an explanatory diagram of the arrangement of an electrically connecting element.

FIG. 34 is an explanatory diagram of the arrangement of the electrically connecting element 80. As illustrated in FIG. 34, one end portion of the connection conductor 47g is located inside the first sub substrate Bs1. The other end portion of the connection conductor 47g is located inside the second sub substrate Bs2. The electrically connecting element 80 is disposed on the main surface of the first sub substrate Bs1. One end of the electrically connecting element 80 is located on the upper side of the first sub conductor Gs1. One end of the electrically connecting element 80 is connected to the first sub conductor Gs1 using a through hole, for example. The other end of the electrically connecting element 80 is located on the upper side of the connection conductor 47g. The other end of the electrically connecting element 80 is connected to the connection conductor 47g using a through hole, for example.

When the connection conductor 47g is insulated from the second sub conductor Gs2 and has a long length in the front-and-back direction, there is a possibility that the connection conductor 47g functions as an antenna that converts electromagnetic waves propagating through the air into a current. The converted current may cause the potential of the first sub conductor Gs1 to fluctuate. As a result, the converted current acts as noise. In the relay 11 according to the fifteenth embodiment, the electrically connecting element 80 is connected between the connection conductor 47g and the second sub conductor Gs2. This prevents the connection conductor 47g from functioning as an antenna.

The relay 11 and the communication device according to the fifteenth embodiment achieve an effect similar to that of the first embodiment. Note that the connection conductor 47g of the substrate connector 47 may be connected to the second sub conductor Gs2 and may be conductively connected to the second sub conductor Gs2. In this case, the electrically connecting element 80 is connected between the first sub conductor Gs1 and the connection conductor 47g.

When the connection conductor 47g is insulated from the first sub conductor Gs1 and has a long length in the front-and-back direction, there is a possibility that the connection conductor 47g functions as an antenna that converts electromagnetic waves propagating through the air into a current. The converted current may cause the potential of the second sub conductor Gs2 to fluctuate. As a result, the converted current acts as noise. Since the electrically connecting element 80 is connected between the first sub conductor Gs1 and the connection conductor 47g, the connection conductor 47g is prevented from functioning as an antenna.

Also, in the fifteenth embodiment, the apparatus connector 34 of the relay 11 may be configured as in one of the second or sixth embodiment. The shape of the apparatus connector 34 may be similar to the shape in one of the third or fourth embodiment. The first sub substrate Bs1 and the second sub substrate Bs2 may be disposed as in the fifth embodiment. When the first sub conductor Gs1 is conductively connected to the first main conductor Gm1, the conductive connection between the first main conductor Gm1 and the first sub conductor Gs1 may be implemented as in the seventh embodiment.

The shape of the communication line connector 30 may be similar to the shape in the eighth embodiment. As in the ninth embodiment, the box 35 of the relay 11 may be fixed to the main surface of the main substrate Bm of the relay apparatus 10. The conductive connection between the second main conductor Gm2 and the second sub conductor Gs2 may be implemented as in the tenth embodiment. As in the eleventh embodiment, the first main conductor Gm1 and the second main conductor Gm2 may be connected via a conducting wire. In this case, in the relay apparatus 10, the common mode choke coil 22 is not used. As in the twelfth embodiment, the first main conductor Gm1 and the second main conductor Gm2 may be connected via the connecting component 61.

Sixteenth Embodiment

In the first embodiment, the apparatus connected to the relay 11 is not limited to the relay apparatus 10. Hereinafter, the differences between the sixteenth embodiment and the first embodiment will be described. Configurations that are not described below are the same as in the first embodiment. Thus, configurations shared with the first embodiment are given the same reference sign as in the first embodiment and description thereof will be omitted.

Communication System 1 Configuration

Figure 35:
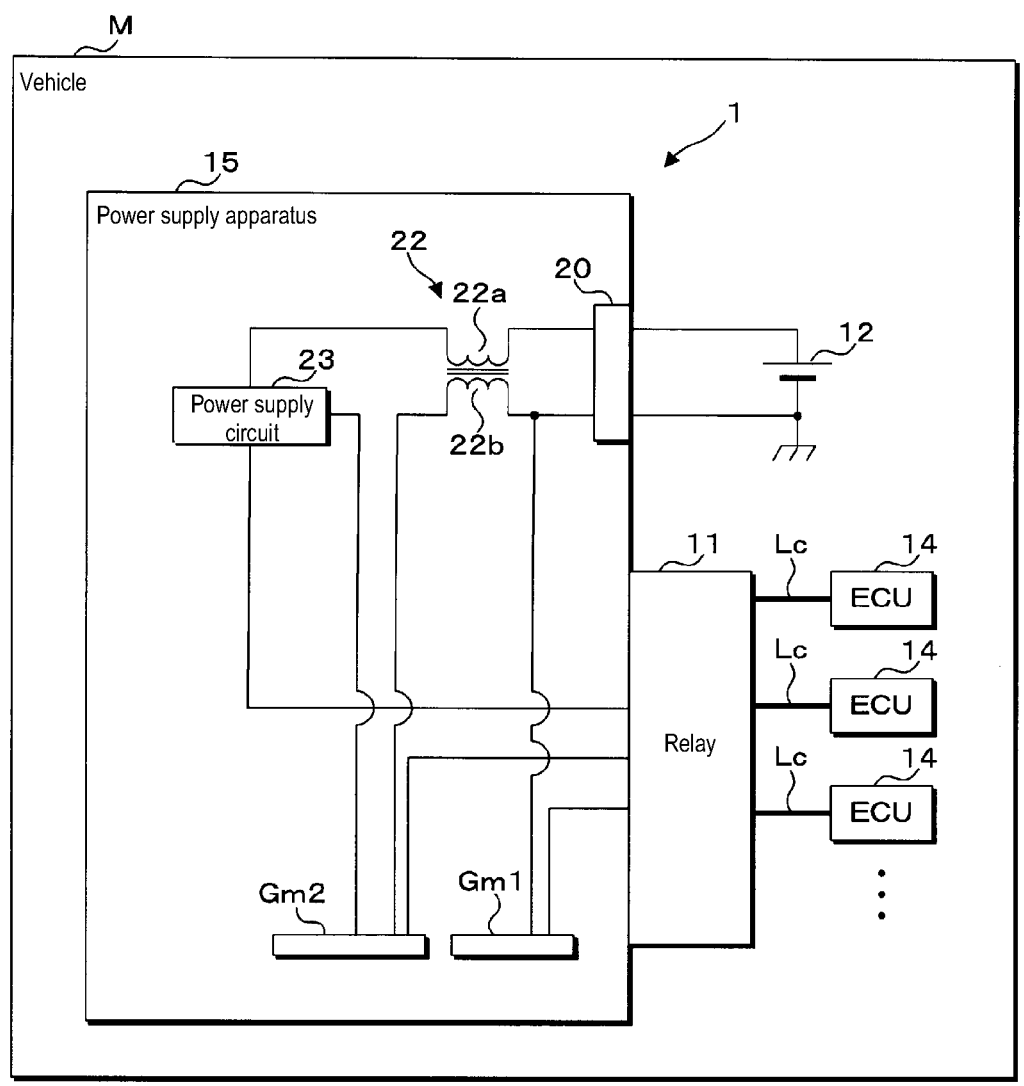
FIG. 35 is a block diagram illustrating the configuration of a main portion of a communication system according to a sixteenth embodiment.

FIG. 35 is a block diagram illustrating the configuration of a main portion of the communication system 1 according to the eleventh embodiment. When the first and the sixteenth embodiment are compared, the apparatus connected to the relay 11 is different. The communication system 1 according to the sixteenth embodiment includes a power supply apparatus 15 instead of the relay apparatus 10. The DC power supply 12 supplies power to the power supply apparatus 15. The power supply apparatus 15 supplies power to the relay 11. In the eleventh embodiment, the plurality of ECUs 14 are connected to the relay 11. As in the first embodiment, the relay 11 relays communication between two ECUs 14.

Power Supply Apparatus 15 Configuration

The configuration of the power supply apparatus 15 is the configuration of the relay apparatus 10 according to the first embodiment except that the one or more bus connectors 21 and the communication circuit 24 is not provided. In the example illustrated in FIG. 35, the second inductor 22b connects the first main conductor Gm1 and the second main conductor Gm2. As described in the description of the first embodiment, a resistor may connect the first main conductor Gm1 and the second main conductor Gm2.

Relay 11 Effects

The relay 11 and the communication device according to the eleventh embodiment achieve an effect similar to that of the first embodiment. Note that the relay 11 may be configured as in any one of the second to fifteenth embodiment.

When the relay 11 is configured as in the eleventh to fourteenth embodiment, the configuration of the power supply apparatus 15 is the configuration of the relay apparatus 10 according to the eleventh to fourteenth embodiment except that the one or more bus connectors 21 and the communication circuit 24 is not provided.

Modified Examples

In the first to sixteenth embodiments, instead of the ECUs 14, another apparatus with a communication function such as a camera may be used. The ECU 14 and an apparatus other than the ECU 14 may be connected to the relay 11. The communication system 1 according to the first to tenth embodiment may further include the relay 11, the plurality of apparatuses (ECUs 14), and the power supply apparatus 15 according to the eleventh embodiment. In this case, for example, two relays 11 are connected via the communication line Lc. The shared DC power supply 12 supplies power to the relay apparatus 10 and the power supply apparatus 15. In the first to eleventh embodiment, the first main conductor Gm1 may be connected to the first sub conductor Gs1 via the apparatus connector 34. In a configuration in which the apparatus connector 34 includes the plurality of conductive rods 34p, the first main conductor Gm1 is connected to the first sub conductor Gs1 via one of the conductive rods 34p.

In the relay 11 according to the first to fourth and the seventh to sixteenth embodiment, a circuit element may be disposed on both main surfaces of the first sub substrate Bs1. In the relay 11 according to the first to sixteenth embodiment, a circuit element may be disposed on both main surfaces of the second sub substrate Bs2. In the first to sixteenth embodiment, the number of the first projection portions 36a or the number of the first projection portions 38 is not limited to two and may be one or three or more. Also, in the first to sixteenth embodiment, the number of the second projection portions 36b or the number of the second projection portions configured in a similar manner to the first projection portions 38 is not limited to two and may be one or three or more.

In the relay 11 according to the first to sixteenth embodiment, the position where the first sub conductor Gs1 is disposed is not limited to inside the first sub substrate Bs1 and may be the main surface or the end surface of the first sub substrate Bs1. In a similar manner, the position where the second sub conductor Gs2 is disposed is not limited to inside the second sub substrate Bs2 and may be the main surface or the end surface of the second sub substrate Bs2. The position where the first main conductor Gm1 is disposed is not limited to inside the first main substrate Bm1 and may be the main surface or the end surface of the first main substrate Bm1. In a similar manner, the position where the second main conductor Gm2 is disposed is not limited to inside the second main surface Bm2 and may be the main surface of the end surface of the second main surface Bm2.

In the first to sixteenth embodiment, the communication lines Lc connected to the relay 11 may be communication buses. In this case, the plurality of ECUs 14 are connected to the communication lines Lc. Communication via the communication lines Lc is performed in a similar manner to communication via the communication buses Lb, for example. Communication via the communication lines Lc is communication according to the CAN communication protocol, for example.

The technical advantages (configuration requirements) described in the first to sixteenth embodiment can be combined with one another, and novel technical advantages can be formed by such combinations. The first to sixteenth embodiment disclosed herein are examples in all respects and should not be interpreted as limiting in any manner. The scope of the present disclosure is defined not by the foregoing description, but by the scope of the claims, and all modifications that are equivalent to or within the scope of the claims are included.

The invention claimed is:

1. A communicator for receiving a differential signal that is a voltage difference between two electrical signals that propagate through two respective conducting wires, comprising:
    a noise removal circuit configured to remove noise from the two electrical signals using a potential of a first conductor as a reference potential;
    a conversion unit configured to convert a differential signal that is a voltage difference between two electrical signals with noise removed by the noise removal circuit into a voltage signal that is a voltage with a reference potential corresponding to a potential of a second conductor;
    a first substrate on which the first conductor is disposed;
    a second substrate on which the second conductor is disposed; and
    a substrate connector with flexibility that connects the first substrate and the second substrate.

2. The communicator according to claim 1, wherein the differential signal is a signal for communication compliant with an Ethernet communication protocol, a signal for communication using low voltage differential signalling (LVDS), or a signal for communication compliant with universal serial bus (USB).

3. The communicator according to claim 1, further including,
    a conductor connecting element connected between the first conductor and the second conductor, wherein
    the conductor connecting element is an inductor, a resistor, or a conducting wire.

4. The communicator according to claim 1, wherein
    a first circuit element is disposed on a surface of the first substrate,
    a second circuit element is disposed on a surface of the second substrate, and
    the surface of the first substrate on which the first circuit element is disposed faces the surface of the second substrate on which the second circuit element is disposed.

5. The communicator according to claim 1, wherein
    a first circuit element is disposed on a surface of the first substrate,
    a second circuit element is disposed on a surface of the second substrate, and
    the surface of the first substrate on which the first circuit element is disposed and the surface of the second substrate on which the second circuit element is disposed are perpendicular to one another.

6. The communicator according to claim 1, further including,
    a box with electrical conductivity that houses the first substrate and the second substrate; and
    a projection portion projecting outward from the box, the projection portion being used for fixing the box, wherein
    the projection portion has electrical conductivity and is conductively connected to the first conductor via the box.

7. The communicator according to claim 6, wherein
the projection portion is provided with a through hole through which a screw with electrical conductivity is inserted,
the box is fixed by the screw being tightened, and
when the box is fixed, the screw is conductively connected to the projection portion.

8. The communicator according to claim 6, further including,
a second projection portion with electrical conductivity that projects outward from the box, the second projection portion being used for fixing the box, wherein
the box includes
a first conductive portion with electrical conductivity conductively connected to the first conductor,
a second conductive portion with electrical conductivity conductively connected to the second conductor, and
a connection portion with electrical conductivity that connects the first conductive portion and the second conductive portion,
the projection portion projects from the first conductive portion, and
the second projection portion projects from the second conductive portion.

9. The communicator according to claim 1, further including,
a conductive rod with electrical conductivity, wherein
the first substrate is provided with an insertion hole through which the conductive rod is inserted, and
the conductive rod is inserted into the insertion hole and conductively connected to the first conductor.

10. The communicator according to claim 1, further including,
an apparatus connector that connects the second substrate and an external apparatus, wherein
the conversion unit is supplied with power via the apparatus connector.

11. The communicator according to claim 10, wherein
the apparatus connector includes a second conductive rod with electrical conductivity, and
the second substrate is provided with a second insertion hole where the second conductive rod is inserted.

12. The communicator according to claim 10, wherein the apparatus connector is an edge connector that projects from the second substrate.

13. The communicator according to claim 10, wherein
the apparatus connector has a plate-like shape and flexibility, and
an end portion of the apparatus connector is installed on the second substrate.

14. The communicator according to claim 1, further including,
a communication line connector connected to a communication line including two conducting wires, wherein
the differential signal is input into the noise removal circuit via the communication line and the communication line connector.

15. The communicator according to claim 14, wherein the communication line connector is an edge connector that projects from the first substrate.

16. A communication device comprising:
a communicator configured to receive a differential signal that is a voltage difference between two electrical signals that propagate through two respective conducting wires; and
a power supply apparatus configured to supply power to the communicator, wherein
the communicator includes
a noise removal circuit configured to remove noise from the two electrical signals using a potential of a first conductor as a reference potential,
a conversion unit configured to convert a differential signal that is a voltage difference between two electrical signals with noise removed by the noise removal circuit into a voltage signal that is a voltage with a reference potential corresponding to a potential of a second conductor,
a first substrate on which the first conductor is disposed,
a second substrate on which the second conductor is disposed,
a substrate connector with flexibility that connects the first substrate and the second substrate, and
an apparatus connector that connects the second substrate and a power supply apparatus, and
the power supply apparatus supplies power to the conversion unit via the apparatus connector.

17. The communication device according to claim 16, wherein
the power supply apparatus includes a first power supply conductor and a second power supply conductor, respectively,
the first power supply conductor and the second power supply conductor are conductively connected to the first conductor and the second conductor, and
the first power supply conductor and the second power supply conductor are connected via an inductor or a resistor.

18. The communication device according to claim 16, wherein
the power supply apparatus includes a first power supply conductor and a second power supply conductor,
the first power supply conductor and the second power supply conductor are conductively connected to the first conductor and the second conductor, respectively, and
the first power supply conductor and the second power supply conductor are connected via a second conducting wire.

19. The communication device according to claim 17, further including,
an electrically connecting element that implements an electrical connection, wherein
the two conducting wires pass through the substrate connector,
the substrate connector includes a connection conductor that conductively connects the first conductor and the second conductor, and
the electrically connecting element is connected between the connection conductor and the second conductor or between the first conductor and the connection conductor.

20. The communication device according to 16, wherein the communicator transmits data included in a voltage signal converted by the conversion unit to the power supply apparatus via the apparatus connector.

* * * * *